United States Patent
Gunapala et al.

(10) Patent No.: US 6,967,345 B1
(45) Date of Patent: Nov. 22, 2005

(54) DUAL BAND QWIP FOCAL PLANE ARRAY

(75) Inventors: Sarath D. Gunapala, Valencia, CA (US); Kwong Kit Choi, Brookeville, MD (US); Sumith V. Bandara, Valencia, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/305,121

(22) Filed: May 4, 1999

Related U.S. Application Data

(63) Continuation of application No. 08/928,292, filed on Sep. 12, 1997, now Pat. No. 6,642,537, which is a continuation-in-part of application No. 08/708,076, filed on Aug. 27, 1996, now abandoned.

(51) Int. Cl.$^7$ .................. H01L 27/146; H01L 31/09

(52) U.S. Cl. ............ 257/21; 257/14; 257/15; 257/294; 438/77; 438/69; 438/94

(58) Field of Search ............... 257/7, 12, 14, 257/15, 17, 18, 21, 22, 294; 438/69, 77, 94

(56) References Cited

U.S. PATENT DOCUMENTS

| | | | | |
|---|---|---|---|---|
| 5,023,685 A | * | 6/1991 | Bethea et al. | 357/30 |
| 5,272,356 A | * | 12/1993 | Wen et al. | 257/21 |
| 5,506,418 A | * | 4/1996 | Bois et al. | 257/15 |
| 5,646,421 A | * | 7/1997 | Liu | 257/21 |

OTHER PUBLICATIONS

Tsai et al., "Two-color infrared photodetector using GaAs/AlGaAs and strained InGaAs/AlGaAs multiquantum wells," Appl. Phys. Lett, 62 (26), Jun. 28, 1993, pp. 3504-3506.*
Tidrow et al., "Grating coupled multicolor quantum well infrared photodetectors," Appl. Phys. Lett, 67 (13), Sep. 25, 1995, pp. 1800-1802.*
Tidrow et al., "A high strain two-stack two-color quantum well infrared photodetector," Appl. Phys. Lett, 70 (7), Feb. 17, 1997, pp. 859-861.*
Fiore et al., "Strained InGaAs/AlGaAs quantum well infrared detectors at 4.5 microns," Appl. Phys. Lett, 64 (4), Jan. 24, 1994, pp. 478-480.*
Steele, "Importance of the upper state position in the performance of quantum well intersubband infrared detectors," Appl. Phys. Lett. 59 (27), Dec. 30, 1991, pp. 3625-3627.*
Flore et al., "Strained InGaAs/AlGaAs quantum well infrared detectors at 4.5 um," Appl. Phys. Lett. 64 (4), Jan. 24, 1994, pp. 478-480.*
Tidrow et al. "Grating coupled multicolor quantum well infrared phtodoetectors," Appl. Phys. Lett, 67 (13), Sep. 24, 1995, pp. 1800-1802.*

* cited by examiner

Primary Examiner—Jerome Jackson
(74) Attorney, Agent, or Firm—Fish & Richardson P.C.

(57) ABSTRACT

A quantum well infrared photodetector (QWIP) that provides two-color image sensing. Two different quantum wells are configured to absorb two different wavelengths. The QWIPs are arrayed in a focal plane array (FPA). The two-color QWIPs are selected for readout by selective electrical contact with the two different QWIPs or by the use of two different wavelength sensitive gratings.

15 Claims, 20 Drawing Sheets

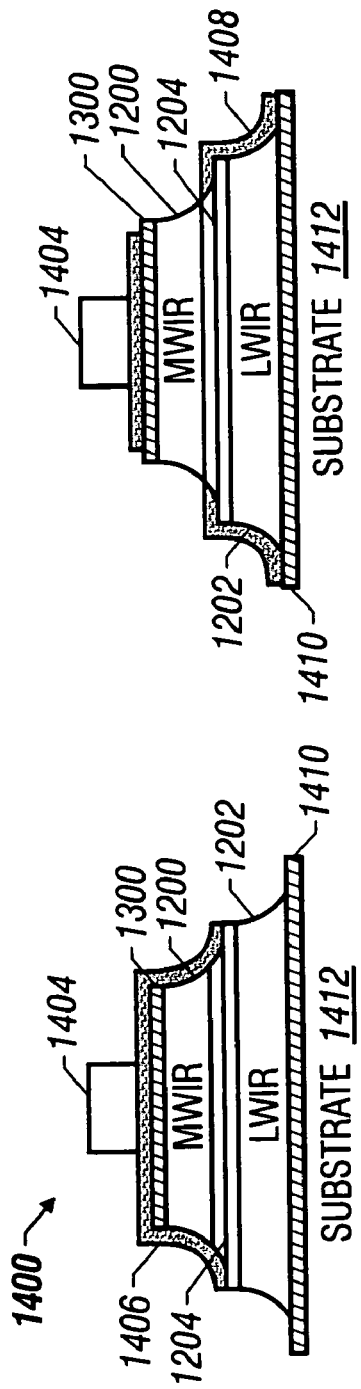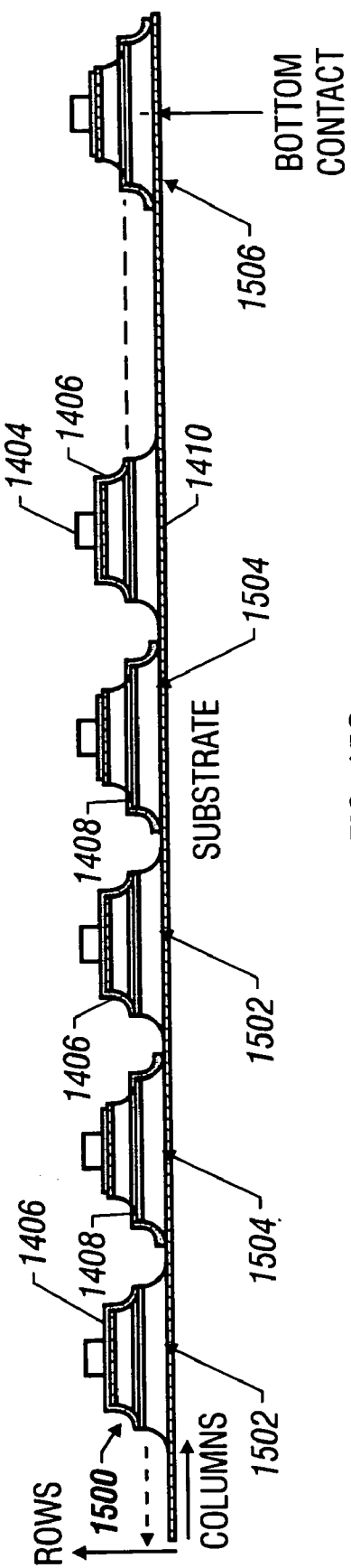

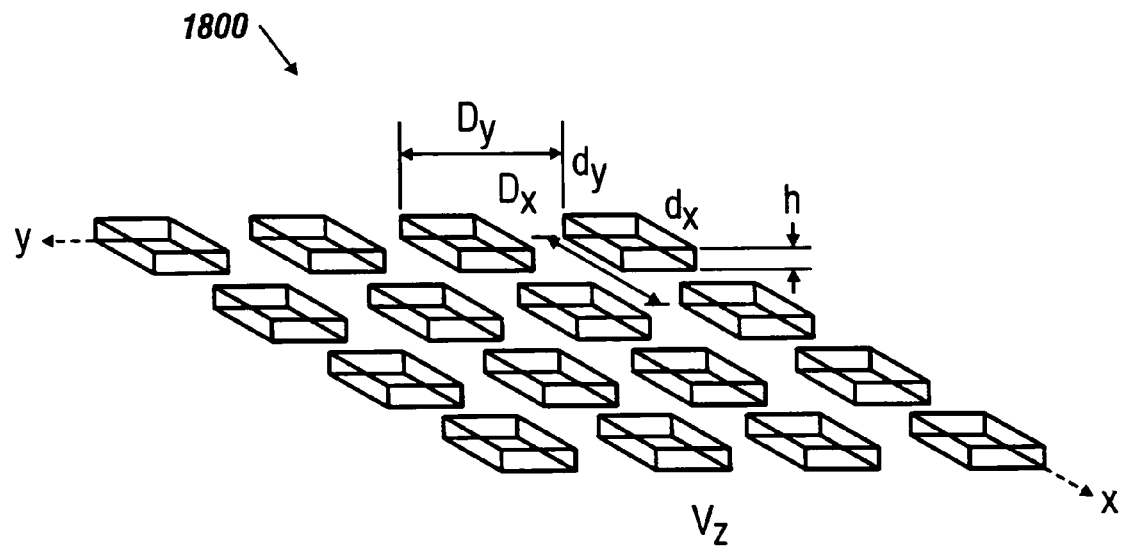
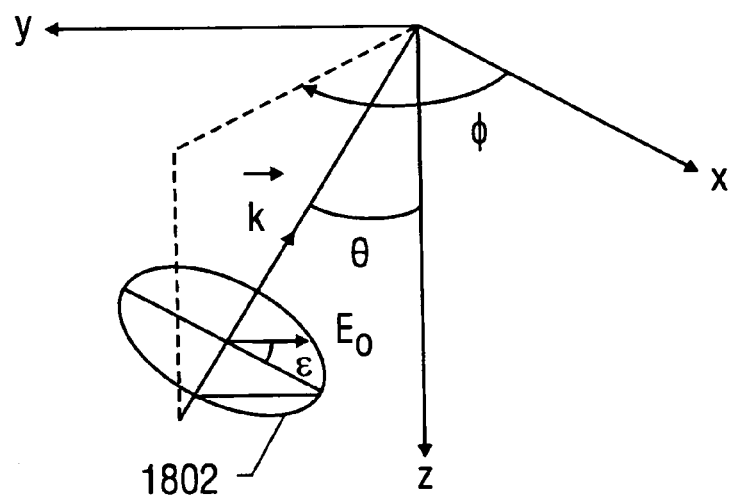
FIG. 18

DUAL BAND QWIP FOCAL PLANE ARRAY

CROSS-REFERENCE TO RELATED APPLICATION

This application is a continuation of Ser. No. 08/928,292 Sep. 12, 1997 U.S. Pat. No. 6,642,537 which is a continuation-in-part of Ser. No. 08/708,076 Aug. 27, 1996 abandoned.

ORIGIN OF THE INVENTION

The invention described herein was made in the performance of work under a NASA Contract and is subject to the provisions of Public Law 95.517 (35 U.S.C. 202) in which the contractor has elected to retain title.

FIELD OF THE INVENTION

This invention relates to quantum-well devices for detecting infrared ("IR") electromagnetic radiation.

BACKGROUND AND SUMMARY

Objects emit infrared radiation according to their temperature. An object at room temperature (i.e., 300° K), for example, emits infrared radiation that has a peak at around 8.5 µm. Even in complete darkness, i.e., in the absence of visible optical wavelengths, the infrared radiation emitted from the object can be detected. That detected radiation can be processed with an infrared-radiation detector to generate an image.

Infrared radiation detectors operating in the range of 8–15 µm have been used in night vision, navigation, flight control, weather monitoring, security, surveillance, and chemical detection. The earth's atmosphere is transparent to 8–12 µm radiation, and infrared-radiation detectors operating in this range are thus used in telescopes, communication systems, and in defense. IR scanner data has also been used to map sulfur dioxide fumes from quiescent volcanos.

The early IR detectors were intrinsic detectors. An intrinsic photodetector takes advantage of optical radiation's capability of exciting a photocarrier, e.g., an electron. Such a photo-excited electron or "photoelectron" is promoted across the band gap from the valence band to the conduction band and collected. The collection of these photoelectrons produces a flow of electrons, which is detected as a current.

An intrinsic photodetector requires that an incoming photon from the radiation to be sensed is sufficiently energetic to promote an electron from the valence band to the conduction band. Hence, the energy of the photon=hv needs to be higher than the band gap $E_g$ of the photosensitive material.

Quantum well detectors are more sensitive. Quantum well photodetectors can be used to form quantum well infrared photodetectors ("QWIPs") that are sensitive to 6–25 µm infrared radiation. A quantum well is formed by packaging a relatively thin layer of a first semiconductor (typically GaAs) between adjacent layers of a second semiconductor (typically $Al_xGa_{1-x}As$). These semiconductor materials have a gap of inherent energies, "a band gap", between them. The materials are used to form an energy "well" in the semiconductor. That well can capture photons generated by the incoming radiation. The electrons are promoted by the photon from a ground state within the well to an excited state.

Spectral response of the detectors has been adjusted by controlling the band gap. However, detection of long wavelength radiation, such as infrared radiation, requires a small band gap; e.g., around 62 meV. These low band gap materials are characterized by weak bonding and low melting points.

The art responded by forming multi-quantum well structures (MQW) made of large band gap semiconductors. Positions of the energy levels in an MQW structure are primarily determined by the well height and width. For example, the energy level separation of the quantum well is increased as the thickness of the GaAs layer is decreased. The well's height also depends on the band gap of the AlxGa1-xAs layer and the relative proportions of Al and Ga ("x") in the AlxGa1-xAs. The intersubband energy, i.e., the energy between the ground state E1 and the first excited state, defines many of the essential characteristics of the quantum well.

Quantum well infrared photodetectors operate based on photoexcitation of an electron between ground and a first excited state in the quantum well. The basic operation of a single well is shown in FIG. 1.

The band gap 110 of the $Al_xGa_{1-x}As$ 112 is different from the band gap 120 between the GaAs layers 122. This difference forms the well which captures the electrons. These photoelectrons can escape from the well and are collected as photocurrent.

The band gap of $Al_xGa_{1-x}As$ can be changed by varying x. This hence changes the height of the well and allows changing the energy required to capture an electron, the "intersubband transition energy."

An intrinsic infrared photodetector, as described above, increases the energy of an electron using one (or many) photons, and detects the resultant photoelectrons. The photon needs to be sufficiently energetic to increase the energy of the electron sufficiently to promote the electron from the valence band 130 to the conduction band 132. This has been called interband operation, signifying the electron's promotion from one band to another band.

The intersubband system shown in FIG. 1 promotes the electrons between subbands—here from one subband 101 to another subband 106. Intersubband transitions operate between confined energy states, i.e., quantum wells associated with either the conduction band 132 or valence band 130 in the quantum well. The promotion is effective at holes in the quantum well.

Different kinds of intersubband transitions exist. A bound-to-bound transition is formed when both the ground state 104, the excited state 106 of the excited electrons are bound within a quantum well 100.

A multi-quantum well system is schematically shown in FIG. 2. Like the FIG. 1 system, the quantum wells generate photocurrent following intersubband absorption between two bound energy levels. A bound-to-bound intersubband absorption requires the infrared wavelengths to excite an electron from the ground state 220a to a bound excited state 222 within the well. The electron then tunnels through the edge of the well via quantum tunneling shown as 230, to an unbound and continuous level above the well level, "the continuum level" 210. The bias on the well excites a flow of electrons through the continuum. This flow of electrons is detected as photocurrent.

The sensitivity of the detector is a function of efficiency of the photocurrent detection, i.e., the amount of detected photocurrent sensitivity is degraded by noise in the detector. Since infrared radiation has less energy than higher frequency electromagnetic radiation such as visible electromagnetic radiation, the system generates relatively less photocurrent. This has provided a unique challenge to enhancing detector efficiency.

Dark current is a source of noise in QWIPs. Dark current is, as the name implies, current that flows in the dark, i.e., even when radiation to be detected is not reaching the QWIP. The dark current in a QWIP originates from three main mechanisms, quantum mechanical tunneling, thermally assisted tunneling and thermionic emissions.

Quantum mechanical tunneling from well to well through the barriers (shown as 224), also called sequential tunneling, occurs independent of temperature. This occurs to a very small extent, and dominates the dark current at very low temperatures.

Thermally-assisted tunneling 226 is based on thermally excited quantum tunneling through the tip of the barrier into the continuum 210. At medium temperatures, e.g., around 45° K for an 8–9 μm detector, thermally-assisted tunneling governs the dark current.

At the more usual high temperatures, greater than 45° K, classical thermionic emissions 228 dominate the dark current. A thermionic emission occurs when the electrons are promoted by thermionic processes, i.e. without an incoming photon.

It is highly desirable to reduce the dark current to make a more sensitive detector, i.e., a detector with higher signal to noise ratio. However, it is also desirable that the detector produce as much photocurrent as possible.

The bound-to-bound system requires a photoexcitation energy, $E_p$ 240 in order to excite it from one state to another. This energy $E_p$ is less than the energy for thermionic emission $E_p$ 242. Since the bound level $E_p$ is within the quantum well, thermionic emission is only caused by those electrons which are sufficiently energetic to escape from that bound level to the continuum 210. The dark current contribution from ED is hence relatively small.

However, since the excited bound level is within the quantum well, the photoexcited electrons escape from the well by quantum mechanical tunneling shown as 230. The resistance against particle tunneling is inversely and exponentially proportional to the distance through which a particle needs to tunnel. The number of particles which will tunnel through a barrier is inversely exponentially proportional to the thickness of that barrier. Most particles will easily tunnel through a barrier that is less than 50 Å in thickness. However, only some particles will tunnel through a barrier between 50 and 100 Å, and any barrier greater than 100 Å in thickness presents a formidable challenge for tunneling. Many of the electrons do not tunnel in this way. Therefore, while the dark current in the bound-to-bound photodetectors is low, the photocurrent has also been low because of the tunneling.

Signal to noise ratio in these detectors can be modeled as:

$$S/N \propto \frac{I_P}{\sqrt{I_D}}$$

Where $I_D$ is the dark current. Both the dark current $I_D$ and the photocurrent $I_p$ are lowered in the bound to bound system.

The level of the bound particles in QWIPs are dependent on characteristics of the QWIP materials. One prior art-attempt to increase signal to noise ratio involved reducing the thickness of the GaAs layer in the FIG. 1 system to thereby elevate the excited state energy level into the continuum level. This intersubband configuration has been called "bound-to-continuum." The photoelectrons are excited into the continuum level, so the photoexcited electrons can escape from the quantum well to the continuum transport without tunneling as shown by 254 in FIG. 2. Hence more of the photoelectrons can escape as photocurrent, increasing the signal S. However, since the EP 250 for this detector is less that the ED 252, the electrons are very energetic. This configuration hence has a very low barrier against dark current through thermionic emission. The energy barrier for thermionic emission (ET) is ten to fifteen meV smaller than the energy required for the intersubband photoionization process. Accordingly, this configuration has higher noise N relative to the bound-to-bound system.

A special form of intersubband absorption is described in this specification which increases the signal S while avoiding or minimizing increase in noise. An absorption subband is described which occurs when the first excited state is in resonance with an area near the top of the barrier. The inventors have titled this a "bound-to-quasibound" transition. Such transitions exist when the thermionic emission energy barrier of the quantum well ($E_T$) is substantially matched to the energy required for photoionization ($E_p$), i.e., preferably within 2% of precise resonance.

This bound-to-quasibound configuration has a thermionic emission energy barrier which is increased relative to the bound-to-continuum transitions. More thermal energy is required to liberate an electron confined in the quantum well. Dark current generated by the quantum well during operation is therefore reduced. However, since the excited state in the bound-to-quasibound configuration is resonant with the thermionic emission energy barrier, electrons can escape with little or no tunneling. The quantum wells with this configuration hence maintain a high quantum efficiency, i.e., a large amount of photocurrent is generated by the incident infrared photons.

These two factors—low dark current and high quantum efficiency—increase the signal-to-noise ratio of the photocurrent generated by the quantum well.

It is hence an object to increase the energy barrier for thermionic emission relative to bound-to-continuum structures. One aspect of the present invention carries out this object by forming bound-to-quasibound quantum wells which exhibit increased sensitivity and improved dynamic range.

The depth and thickness of the quantum well are modified so that the first excited state is resonant with (i.e., has substantially the same energy as) a portion of the "bottom" (i.e., the lower energy barrier) of the quantum well. The energy barrier for thermionic emission is thus substantially equal to the energy required for intersubband absorption. Increasing the energy barrier in this way significantly reduces dark current while the photocurrent generated by the quantum well is maintained at a high level.

Bound-to-quasibound QWIPs exhibit peak sensitivities at a value that is based on the material thicknesses. An exemplary value is 8.5 μm at 70° K. However, this value can be changed by appropriate adjustment of the well width $L_W$ and the barrier height $E_G$.

A single QWIP includes a quantum well structure with about 50 quantum wells. Each well preferably includes a 40–70 thick GaAs between two 300 Å–500 Å $Al_xGa_{1-x}As$ barrier layers. The mole fraction (x) of Al is preferably 0.3. Each quantum well is preferably doped with a density of n-type carriers (typically $5\times10^{17}$ cm$^3$) to lower the Fermi energy of the carriers and further reduce dark current.

The QWIP quantum well structure of the preferred embodiment is formed between silicon-doped GaAs electrical contact layers. These layers are attached to electrical leads which supply an electrical bias which facilitates collection of photocurrent. All layers are preferably formed on a GaAs substrate.

The QWIP primarily absorbs radiation having a polarization component along the growth axis (i.e., thickness) of the quantum well. The QWIP thus preferably includes a randomly reflecting surface (e.g., gold) patterned on the top electrical contact layer. Radiation passes into and through the bottom of the QWIP and irradiates the reflecting surface. Internal reflections within the quantum well structure adjust angles of the radiation relative to the growth axis to facilitate optical absorption. The number of internal reflections is maximized by making the GaAs substrate as thin as possible.

QWIPs accordingly to the embodiment are preferably patterned on the GaAs substrate in a 256×256 pixel array although other sizes are contemplated. This structure is preferably incorporated in a QWIP/silicon CMOS multiplexer hybrid detector used for generating two-dimensional infrared images.

QWIP pixel arrays are formed by first growing a stop-etch layer and an electrical contact layer on a 3-inch GaAs wafer. This area is called the "bottom" of the structure. The quantum well structure is formed by growing alternating $Al_xGa_{1-x}As$ barrier and GaAs well layers on top of the electrical contact layer. A final electrical contact layer is then grown on top of the quantum well structure.

Each layer is grown by molecular beam epitaxy (MBE). Multiple QWIP arrays are then patterned using standard photolithography and chemical etching techniques. The GaAs wafer is then diced to form individual GaAs substrates, each containing a single focal plane array.

The system of the present invention is often used in special cameras and systems. The focal plane array described in this specification is often used as a hybrid along with its CMOS support circuitry. This produces its own special host of problems.

A single GaAs focal plane array is attached to the CMOS multiplexer pixel array and "thinned" substantially down to the stop-etch layer. A special photolithographic thinning process which reduces the aspect ratio (i.e., the ratio of thickness to width) of the QWIP array is described. Thinning the substrate improves optical coupling, minimizes thermal mismatch between GaAs and CMOS logic families, and minimizes optical crosstalk between adjacent pixels.

The thinning process includes an abrasive polishing step for removing the first 500 $\mu$m of the substrate. A chemical polishing step (using a bromine:methanol mixture at a ratio of 1:100) is then used to remove the next 100 $\mu$m of substrate. Outer surfaces of the QWIP photodetector except for the GaAs substrate surface are then covered with a standard photoresist. A wet chemical etching step using a $H_2SO_4$:$H_2O_2$:$H_2O$ solution (5:40:100) removes the next 20 $\mu$m from the substrate. The etching process is continued until about 5 $\mu$m of the GaAs substrate remains. The detector is then loaded into a plasma etching chamber evacuated to a pressure of less than $1 \times 10^{-6}$ torr. $CCl_2F_2$ flows in the presence of a radio frequency ("RF") to form a plasma in the chamber to etch the substrate until the stop-etch layer is reached. The thinned QWIP pixel array attached to the CMOS multiplexer pixel array is then processed with a final cleaning step and removed from the chamber.

Bound-to-quasibound QWIPs exhibit relatively low amounts of dark current due to their increased energy barriers for thermionic emission. Lowering the dark current increases the sensitivity and dynamic range of the QWIP. The first excited state of the bound-to-quasibound QWIP is resonant with the top of the well. This configuration maintains the quantum efficiency, of the QWIPs (i.e., the number of photocarriers generated for each incident photon) and sensitivity at a high level.

QWIPs according to the techniques described in this specification can be used to form a photodetector having high-quality images and having high signal-to-noise ratios.

Many applications require both mid-wavelength infrared (MWIR) and long wavelength infrared (LWIR) sensing. Two-color sensing is desirable to determine the absolute temperature of a target. The absolute temperature simplifies the identification of targets (such as warheads) from decoys. Without the absolute temperature, it is difficult to determine whether a given level of infrared input is emitted from a large and relatively cool object, or from a smaller, but hotter object. This is because these two very different objects might transmit the same amount of infrared signal (flux) at a single wavelength. With data from two different wavelengths, the different number of photons at the different wavelengths can be used to fit the data to known blackbody radiation curves. These curves define the asbsolute temperature of an object, and hence, will reveal which detected object is the hotter, and which is cooler.

Two-color sensing also enables fast and effective target recognition, and is useful in many scientific applications, e.g., thermal infrared multi-spectral scanners (TIMS) used in volcanology and geology. Hence, it is desirable to make sensors that exhibit multi-spectral (dual wavelength) sensing, narrow bandwidth, high resolution, large size, uniformity in sensing, reproducibility, low cost, low 1/f noise, low power dissipation, and radiation hardness.

Prior two-color infrared sensors have generally employed a separate focal plane array (FPA) for each wavelength band. One problem with separate FPA's is the need for two sets of optics, which significantly increases the size of the instrument. Also, in high resolution applications, if the two FPA's are misregistered by even one pixel, the data becomes meaningless. Hence, existing dual wavelength detectors have not generally performed satisfactorily, particularly in high resolution applications. What is needed is a high resolution two-color QWIP focal plane array.

The present inventors have recognized that the aforementioned GaAs-based quantum well infrared photodetectors (QWIPS) have characteristics that make them good candidates for a multi-spectral FPA that meets all of the previously discussed criteria.

Voltage tunable two-stack QWIPs have been considered. They typically include two QWIP structures, one tuned for medium wavelength infrared (MWIR) detection, and the other tuned for long wavelength (LWIR) detection. To the inventors' knowledge, this kind of QWIP structure has not yet been developed into a satisfactory focal plane array camera. One reason is that voltage tunable two-stack QWIP FPA cameras need two different voltages to operate in two different spectral regions. CMOS FPA readout multiplexers are needed to supply the voltages, but they cannot satisfactorily provide the required two voltage levels (e.g., 4V and 8V). Another difficulty is that the LWIR segment of a two-stack QWIP FPA requires very high bias (greater than 8 volts) to switch on the LWIR detection. Such high voltages are either not available in many applications, or when available, can overload circuits. The two different voltages also can give rise to crosstalk between the two different wavelength signals.

It is hence an object of the invention to provide a dual wavelength infrared FPA that is sensitive to two different spectral regions and that does not require either two different voltages or a high bias voltage. The present invention meets this object with a QWIP FPA having a first MWIR QWIP structure tuned to MWIR wavelengths, and a second LWIR QWIP structure on the same substrate tuned to LWIR wavelengths.

In a first embodiment of the invention, each pixel of the two-color QWIP FPA includes a stack of multiple MWIR QWIP structures formed on top of another stack of multiple LWIR QWIP structures. The MWIR and LWIR structures are separated by an intermediate contact layer. These stacked structures are arranged, one per pixel, in rows and columns in the FPA. Direct electrical contact is made with each of the MWIR and LWIR structures. In a second embodiment, the QWIP is constructed in the same way as in the first except that the MWIR QWIPs on odd rows and the LWIR QWIPs on even rows of the FPA are short-circuited during a metalization process. As a result, on odd rows only LWIRs in the stack are operational and on even rows only MWIRs are operational. This structure of interlaced short-circuited MWIR and LWIR detectors eliminates problems associated with voltage tunable QWIPs. In addition, this structure allows a simultaneous detection at both MWIR and LWIR spectral bands.

As discussed above, the quantum mechanical selection rules for infrared intersubband transition require a component of the optical electric field along the quantum well growth direction. Hence, QWIPs primarily absorb infrared radiation that has a polarization component along the growth axis (i.e., thickness) of the quantum wall. This is why QWIPs do not always respond well to normal incident light; it's also why large two dimensional FPAs usually require an optical coupling mechanism to couple the normal incident light into individual detectors.

Optical coupling in QWIPs can be accomplished by random reflectors, or by gratings patterned on the top electrical contact layer. However, the light coupling efficiency of a random reflector is nearly independent of the wavelength due to the random nature of the reflector. Hence, random reflector coupled QWIPs do not generally exhibit narrow band spectral response.

A third embodiment of the invention carries out this object by creating spectral selectivity through the use of optimized cross-gratings. Unlike random reflectors, the light coupling efficiency of cross-gratings strongly depends on wavelength because of the periodicity of the cross-gratings. The optimized set of grating parameters associated with the particular spectral response of the QWIP can be obtained by using a modal expansion technique. Also, in the third embodiment the barrier layers between the wells in the MWIR and LWIR structures are made of the same material and have the same barrier height to provide a smooth continuum transport band.

Optimized gratings can be used on both single and dual wavelength QWIP FPAs. On the two-color FPA of the third embodiment of the invention, cross-gratings optimized for multiple wavelengths are used to selectively read one of the two different wavelength-sensitive QWIPS. For example, in this embodiment, alternating rows of dual wavelength-sensitive QWIPs, are coupled to alternating rows of different cross-gratings. The cross-gratings are optimized to the wavelength sensitivity of one of the QWIPs in the row. The result is a substantial increase in optical coupling efficiency as well as a significant reduction in the spectral bandwidth as compared to QWIPs without the optimized cross-gratings.

A preferred embodiment of the two-color QWIP FPAs of the second and third embodiments have 640×486 pixels, and are hybridized to a 640×486 CMOS multiplexer. The readout multiplexer consecutively reads alternate rows of the FPA to produce separate MWIR and LWIR imagery of the same field of view. The second embodiment discriminates between the two different wavelengths during readout by selective contact with the alternate rows; the third embodiment discriminates different wavelengths by the use of gratings.

The low voltage operation of the invention reduces power dissipation. Furthermore, the two-color QWIP FPA exhibits the same advantages as the single color QWIP FPAs discussed above. These include large size, uniform image, reproducible image, low cost, low 1/f noise, and radiation hardness.

BRIEF DESCRIPTION OF THE DRAWINGS

These and other aspects of the present invention will now be described in detail with reference to the accompanying drawings, in which:

FIG. 15A shows a cross-sectional view of a single pixel in the two-color QWIP FPA of the second embodiment of the present invention;

FIG. 15B shows a cross-sectional view of a single pixel in the two-color QWIP FPA of the second embodiment of the present invention;

FIG. 15C shows a single row of the two-color QWIP FPA of the second embodiment of the present invention;

FIG. 18 shows a preferred grating structure of the third embodiment of the invention;

DETAILED DESCRIPTION

Figure 3B:
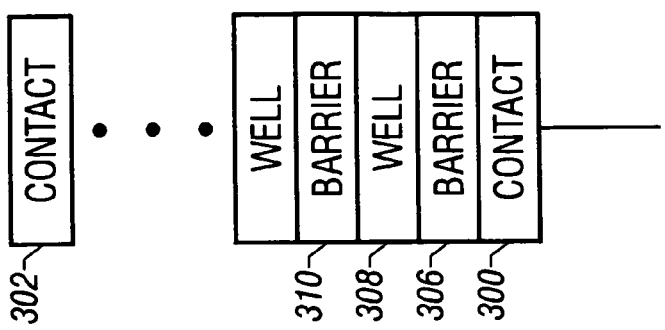
FIG. 3B shows the layers forming the QWIP of one embodiment of the present invention.
Figure 3A:
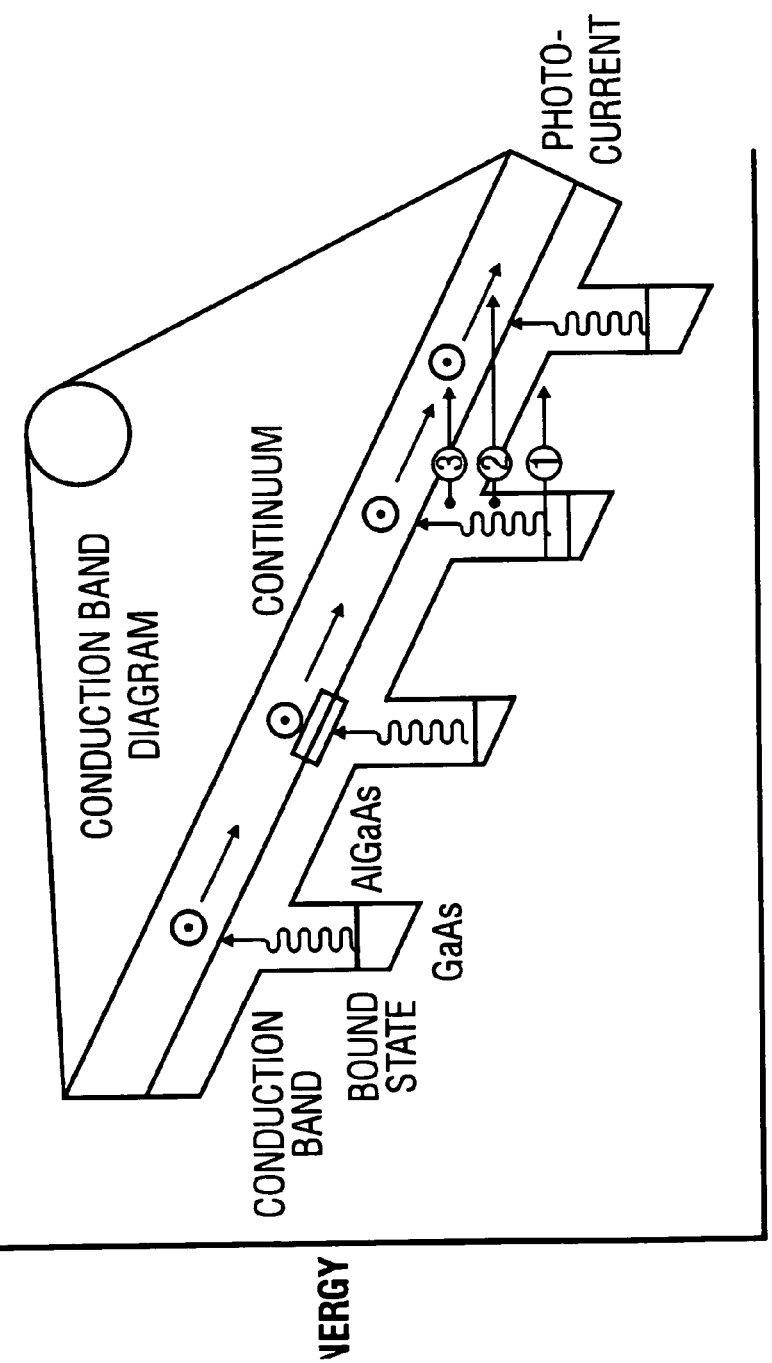
FIG. 3A depicts the energies of particles in a quantum well for a device of an embodiment of the present invention.

FIG. 3A shows the structure of the preferred bound-to-quasibound QWIP of this embodiment and FIG. 3B shows the layers forming the device. Bottom contact layer 300 and top contact layer 302 form the two ends of the QWIP. Each of these contact layers is preferably a silicon doped element with doping of $N_d = 1 \times 10^{18}$ cm$^{-3}$. The contact layers 300 and 302 are between one half micron and one micron in thickness. The contact layers are separated by 50 periods of well materials. Each period includes 300–500 Å thick $Al_xGa_{1-x}As$ barriers 306, 310, preferably 500 Å; where x is approximately equal to 0.10 –0.40; preferably 0.3. Each period also includes GaAs quantum wells 308 of 45 to 80 Å; preferably 50 Å.

Figure 4:
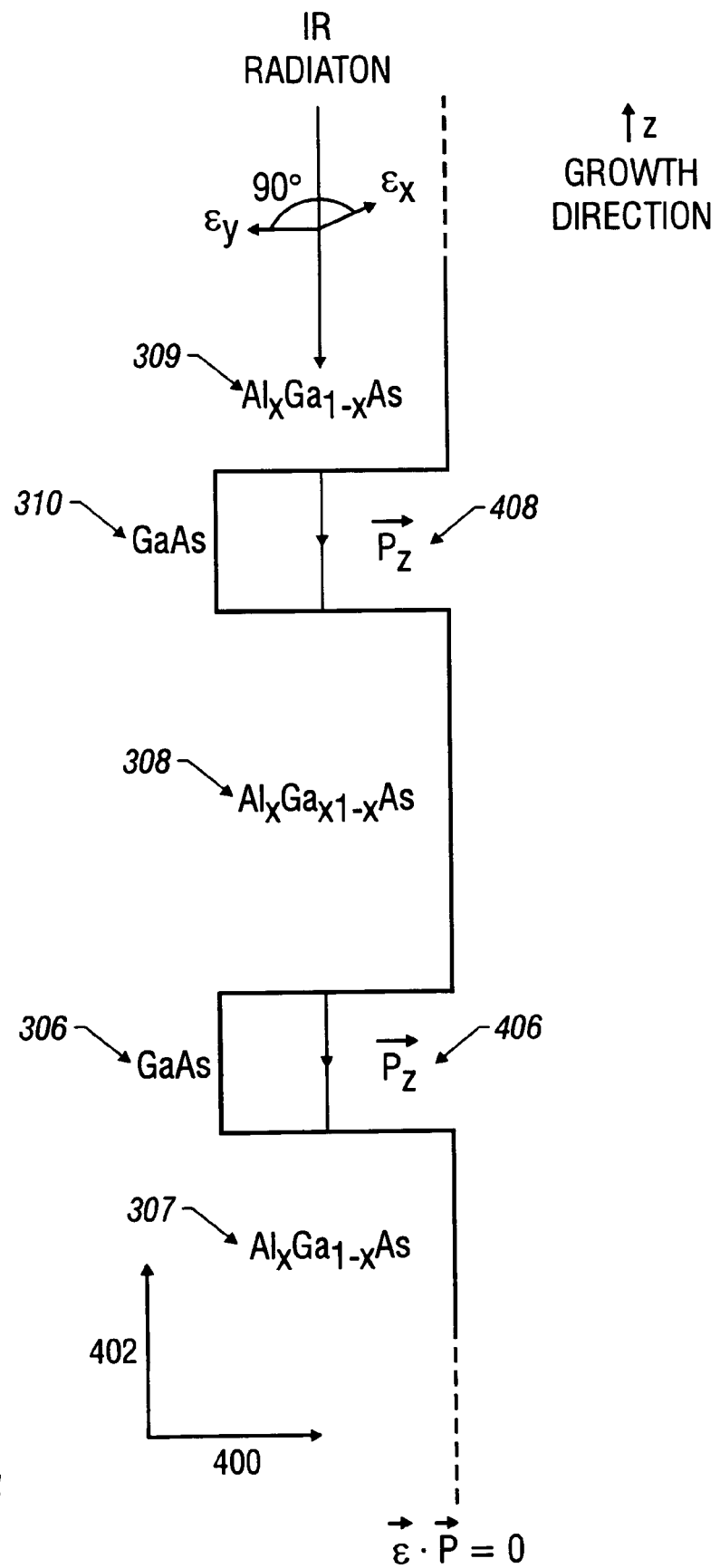
FIG. 4 shows a relationship between the quantum wells, the energy and the incoming radiation.

The photocarriers will be assumed throughout this specification to be formed by electrons. The un-excited electron is at ground state 450, and can be excited to excited state 452. The resulting energy level is shown in FIG. 4, where the horizontal axis 400 of the diagram indicates energy; the vertical axis 402 is a spatial dimension along the growth axis z (i.e., the thickness) of the quantum well.

Quantum wells 406, 408 are formed as thin well layers of GaAs, 306, 310, between the two neighboring barrier layers of $Al_xGa_{1-x}As$ 307, 308, 309. The GaAs thickness forms the well width. Each quantum well 406, 408 is shown with a square shape based on the band gap of the $Al_xGa_{1-x}As$ barrier layers being larger than that of the GaAs well layer. The band gap of $Al_xGa_{1-x}As$, and thus the well depth, is precisely controlled by varying the Al mole fraction (x). The thicknesses of the GaAs 306 and $Al_xGa_{1-x}As$ 307, 308, 309 layers determine, respectively, the width of the quantum wells and the spatial distance between wells. Preferably the material forming the wells 406, 408 is an order of magnitude thinner than the material forming the barrier 308.

The bound-to-quasibound energy-level configuration of the quantum wells 406, 408 is obtained by controlling the properties and quantities of the GaAs and $Al_xGa_{1-x}As$ materials to effect the necessary resonance relationship. The mole fraction of Al can be increased to increase the well depth 30. The thickness of the GaAs well layer can be decreased to increase the separation between the ground 20 and excited state 24 and the well depth 30. The preferred bound-to-quasibound configuration results when the photoionization ($E_p$) is substantially equal to the thermionic emission energy barrier. At this time, as shown in FIG. 3A, the excited state 452 of the electron is substantially resonant with the bottom portion 471 of the well top. The excited state lies slightly below the continuum of higher energy excited states.

Another preferred embodiment uses GaAs well layers which are 45 Å thick surrounded by $Al_xGa_{1-x}As$ barrier layers which are 500 Å thick. The mole fraction of Al (x) in the barrier layer is preferably 0.29.

FIG. 3A shows an energy level diagram of multiple bound-to-quasibound quantum wells biased with an applied voltage. The bias voltage skews the shape of the energy levels so that photocurrent formed by the photoelectron 210 flows energetically "downhill" from the top 480 of the QWIP to the bottom 482. This skewed well has a top edge 473, and a lower energy bottom edge 471. During operation, infrared radiation (indicated by the arrows 460) produce an energy (hc/λ) which is close to being resonant with the energy level of the lower edge 471. This energy promotes a confined electron to the excited state 452. This process generates the photoelectrons 462 which flow as photocurrent when the quantum well is biased. A photon with a non-resonant wavelength is not absorbed by the quantum well, and does not generate photocurrent.

The excited state is considered to be substantially resonant when it brings the photoelectron to within 2–5% of the bottom edge 471, preferably within 2% and more preferably within 2–3 meV of the edge. Most preferably the photoelectron is precisely at the edge 471, or lower than the edge by the small amount described above. This allows the photoelectron to escape to the continuum with no tunneling (if at the edge 471) or with minimal tunneling through only a small part, within 2–3 meV of the well. The amount of tunneling is less than 80 Å, more preferably less than 50 Å, and even more preferably 38 Å or less. This provides a minimal barrier against collection since the tunneling difficulty increases exponentially with barrier thickness.

Figure 5:
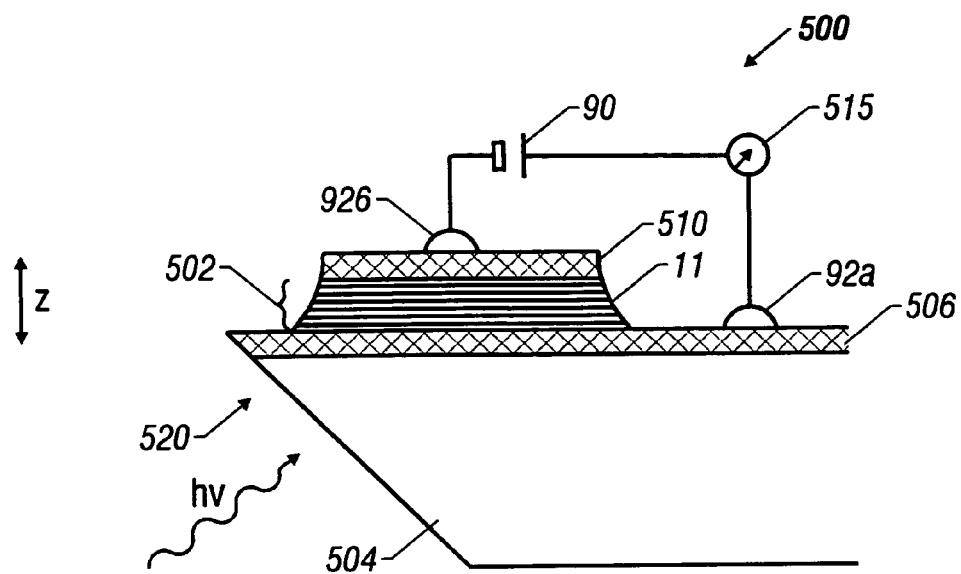
FIG. 5 shows a cross-sectional view of a detector or a single pixel.

FIG. 5 shows a quantum well infrared photodetector 500. Quantum well structure 502 is formed using the structure of FIGS. 3A and 3B, with each quantum well having a well layer of GaAs formed between $Al_xGa_{1-x}As$ layers. The quantum well structure 502 includes multiple quantum wells 11, each exhibiting the bound-to-quasibound intersubband transitions. All layers are grown on a semi-insulating GaAs substrate 504. A bottom electrical contact layer 506 is disposed between the GaAs substrate 504 and the quantum well structure 502. A top electrical contact layer 510 lies on top of the quantum well structure 502.

The contact layers 506, 510 are doped with n-type charge carriers to facilitate generation of photocurrent during operation. A voltage source 90 is connected to the contact layers 506, 510 via leads 92a, 92b and used to bias each quantum well 11 in the quantum well structure 82. Radiation-induced photocurrent is recorded with a current-measuring instrument 515.

The number of quantum wells within the quantum well structure 502 is selected to maximize optical absorption and also the amount of generated photocurrent taking into account a desired photoconductive gain. The optimum number of quantum wells within the structure is preferably around 50. This number represents a tradeoff between the distance that a photoelectron generated in one well of the structure can traverse through the continuum without being captured downstream by a separate well, and optical gain.

Reducing the number of quantum wells from 50 results in lower optical absorption but a higher relative fraction of the generated photoelectrons being collected. This also affects the optical gain of the device, and hence the noise. An optical gain of 1 represents that each photoelectron, statistically, travels the entire distance from its well to collection without being recaptured. Higher optical gains have higher dark current, however. The inventors prefer an optical gain of 0.1, which means that 10% of the particles go from well to collection without recapture. When the photoconductive gain is low, the noise in the detector can be somewhat reduced.

Figure 1:
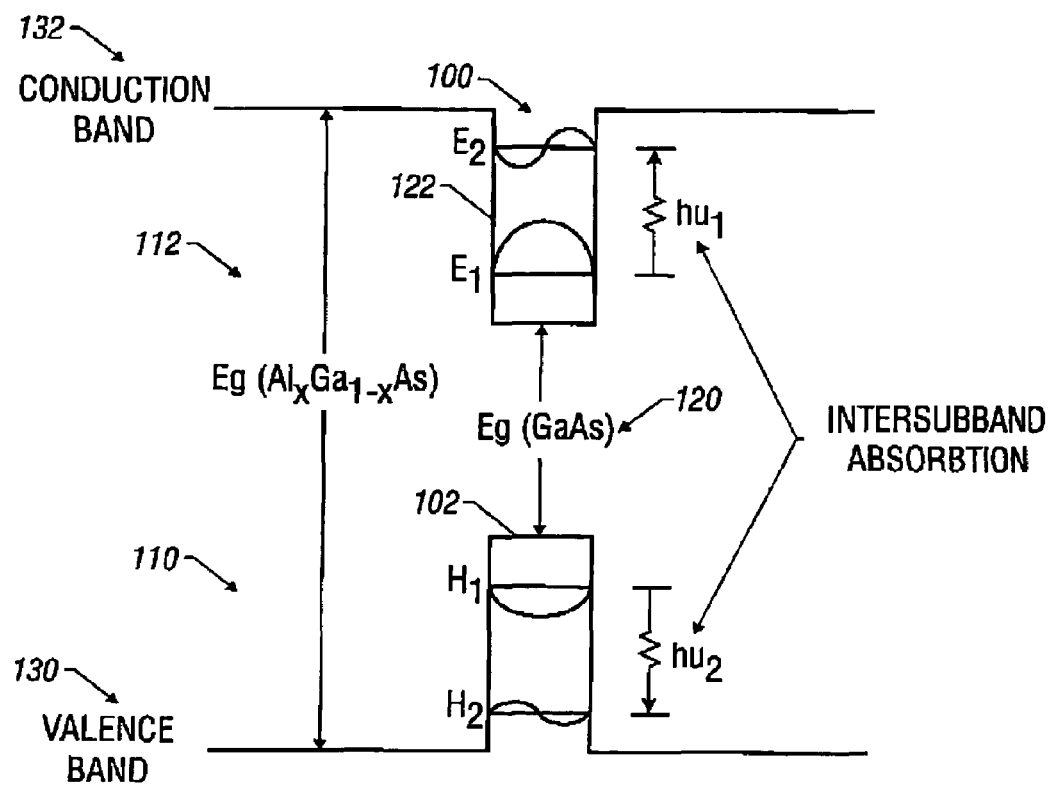
FIG. 1 shows a diagram of a single quantum well.
Figure 2:
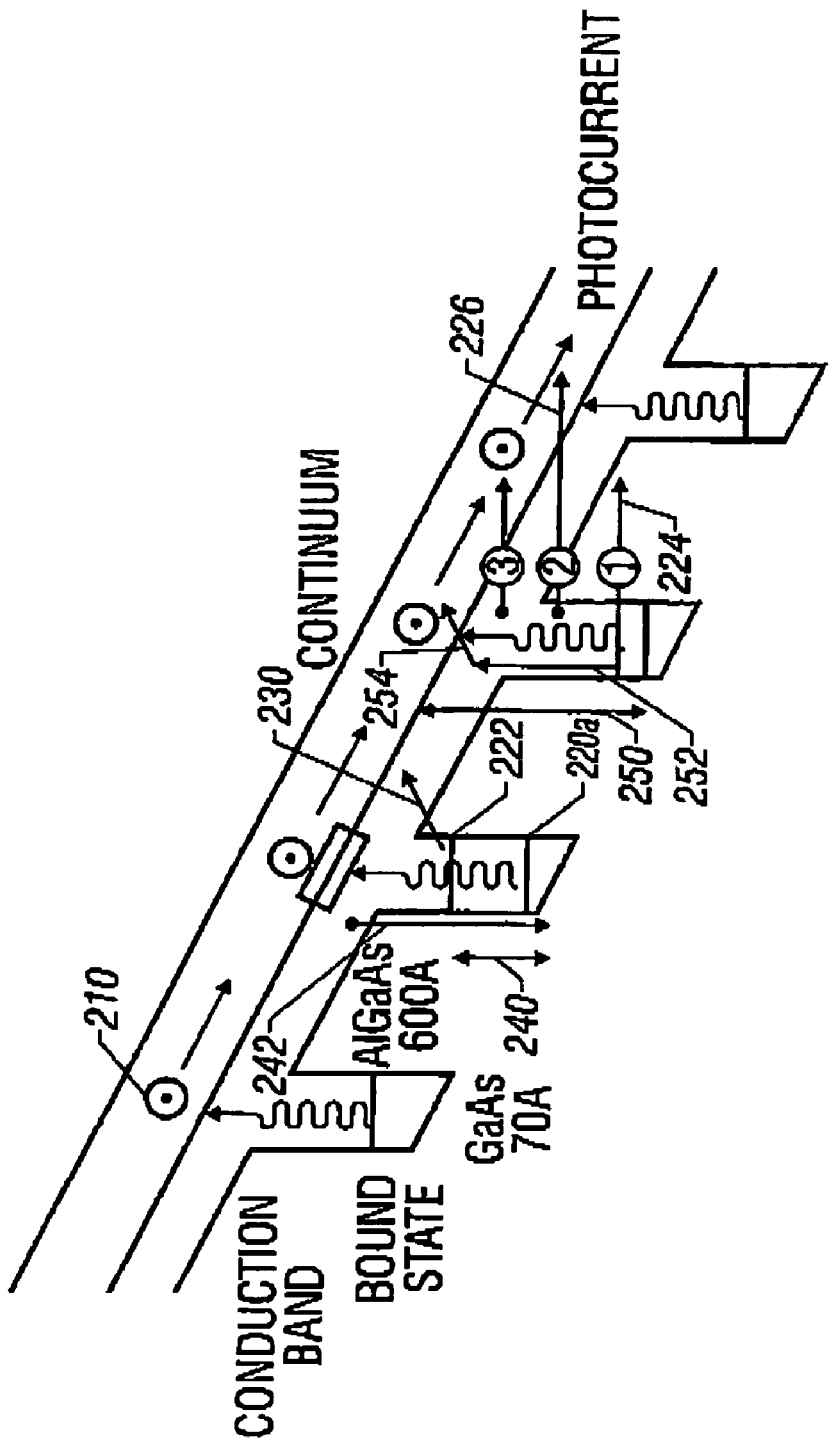
FIG. 2 depicts the energies of particles in a quantum well, and the energy areas of that quantum well biased with an electric field for the bound-to-continuum detectors.

The quantum well structure 502 may otherwise have the same physical dimensions as described for FIG. 1. Contact layers 506, 510 on each side of the well structure have thicknesses of, respectively, 1.0 and 0.5 microns. Both contact layers are doped with silicon at a concentration of $N_D=1\times10^{18}$ cm$^{-3}$. GaAs and $Al_xGa_{1-x}As$ layers within the quantum well structure are doped to $N_D=5\times10^{17}$ cm$^{-3}$ to lower the Fermi energy of the electrons in the quantum well.

As described above, quantum wells usually do not absorb radiation incident normal to their surface; the radiation must have an electric field polarization along the quantum well growth axis (z) to be absorbed. The GaAs substrate 504 therefore includes a 45° polished facet 520 which is angled relative to the z axis. Optical absorption is enhanced when radiation passes through the polished facet 520 and enters the quantum well structure at an angle relative to the z axis. The radiation is then absorbed to generate a photocurrent.

Other mechanisms are also used for adjusting the angle of the incident radiation relative to the z axis. A random, roughened reflecting surface can be patterned on the bottom surface of the bottom electrical contact layer or top of the top electrical contact on the surface layer. Highly reflective materials (e.g., gold or silver) are preferably used for the random reflectors. In this configuration, radiation that is normal to the top surface of the QWIP passes through the quantum well structure and irradiates the roughened, reflecting surface. Subsequent internal reflections within the quantum well structure are angled relative to the growth axis (z). The internally-reflected radiation is absorbed by the quantum well structure to generate photoelectrons.

Radiation within a small cone (typically 17° from normal) is outside of the critical angle required for internal reflection. Radiation in this cone thus escapes through the top surface of the QWIP. The total number of internal reflections (and thus the number of photoelectrons) is maximized by making the GaAs substrate as thin as possible. A preferred "thinning" method according to the invention is described in detail below.

The electron in the excited state can be easily pushed from the bound-to-quasibound state into the continuum. An important advantage is that the photoexcited electrons can escape from the quantum well to the continuum transport states with little or no tunneling. This allows reduction of the bias required to efficiently collect the photoelectrons and hence reduces the dark current. Moreover, since the photoelectrons do not have to tunnel through thick barriers, the $Al_xGa_{1-x}As$ barrier thickness of the bound-to-continuum QWIP can be increased without correspondingly reducing photoelectron collection efficiencies. This embodiment uses a barrier width is preferably 500 to 600 Å and the quantum well width which is preferably 40 to 70 Å. This is an increase of five over many conventional QWIPs.

Figure 6:
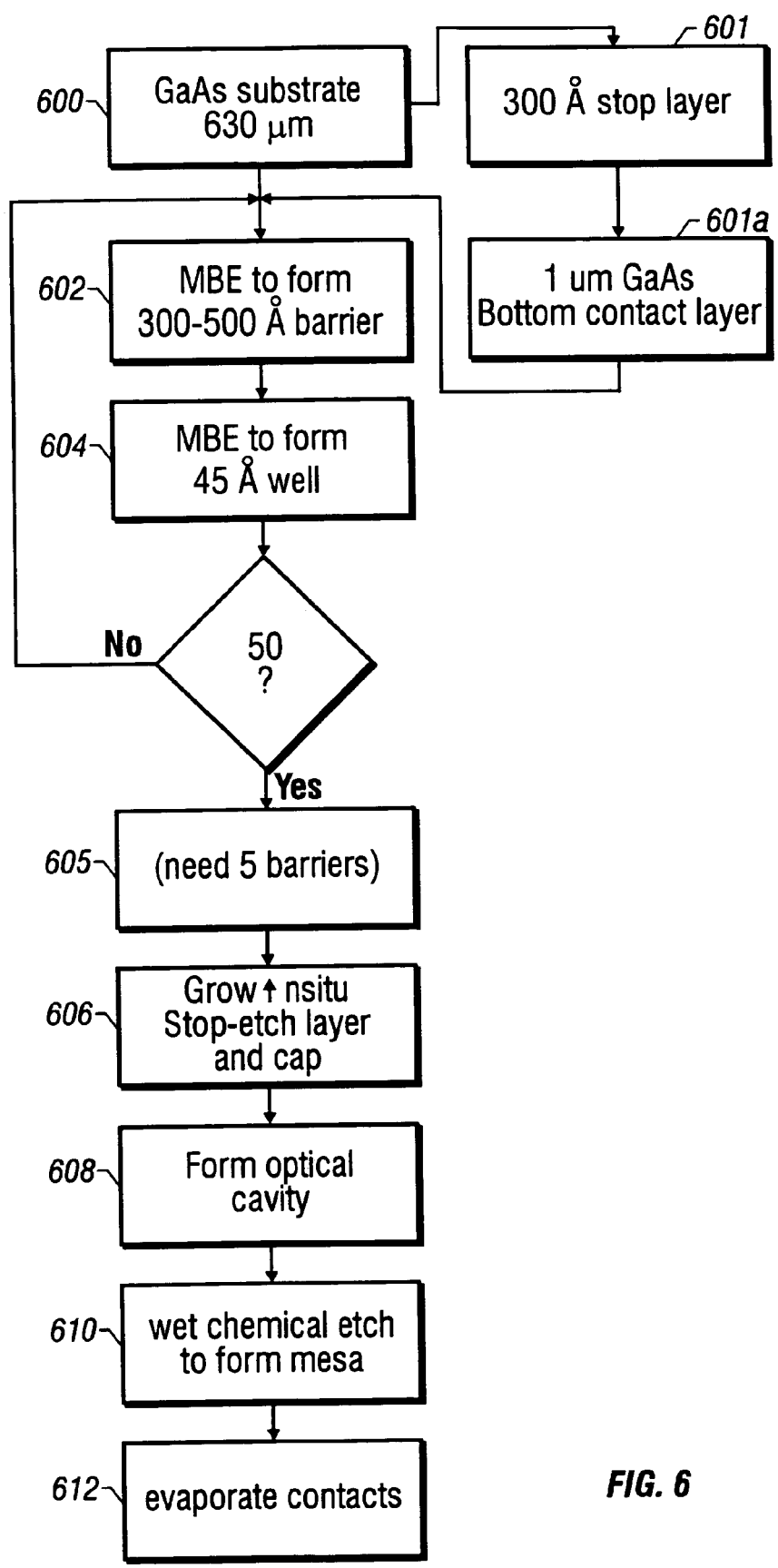
FIG. 6 shows a flow diagram of the process for forming the QWIP of an embodiment.
Figure 7:
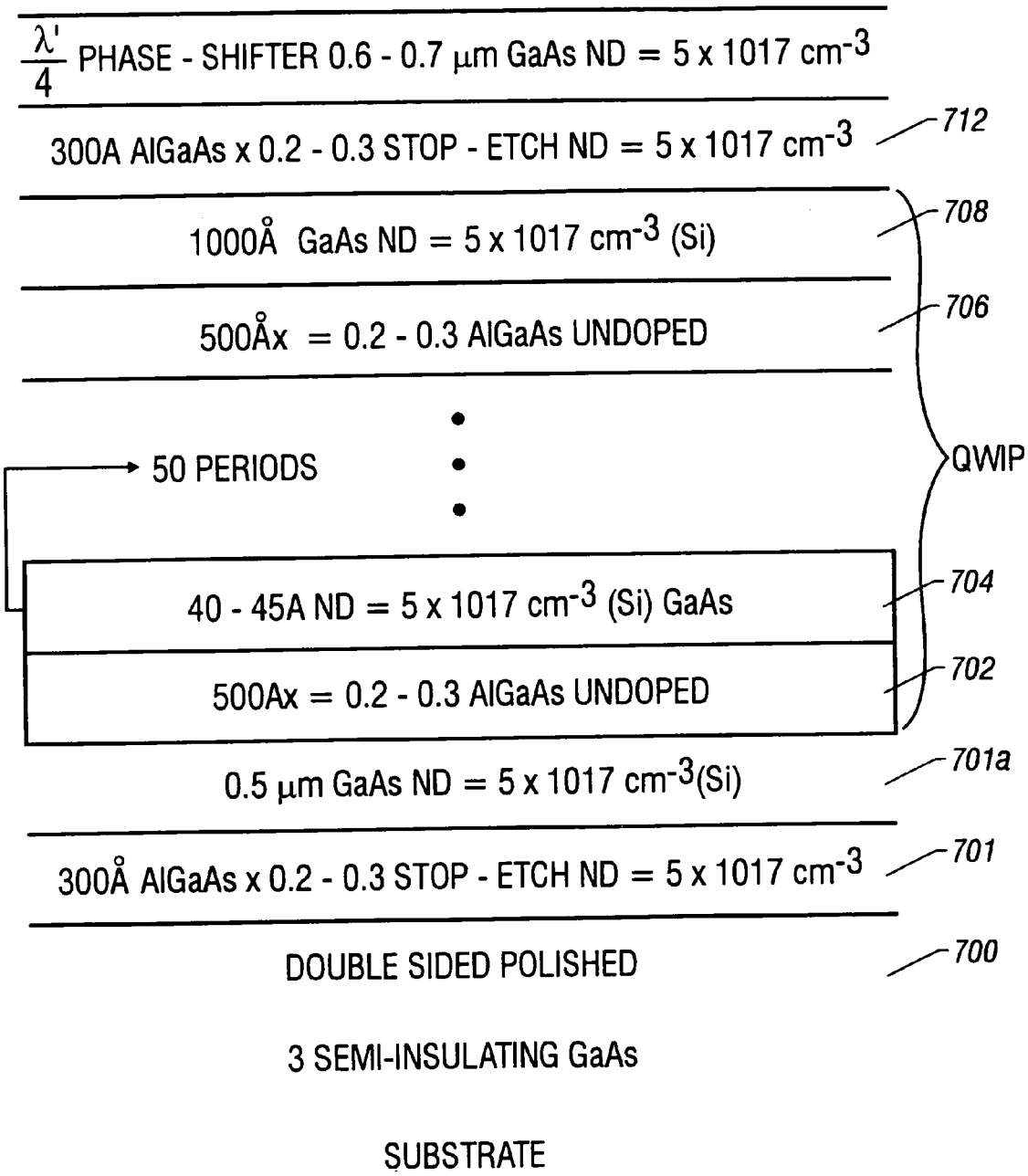
FIG. 7 shows a layer diagram of the QWIP formed employing the flow diagram of FIG. 6.

A second embodiment of the invention is formed as described herein with reference to FIG. 6 to form the layered structure shown in FIG. 7. At step 600, a GaAs substrate of 630 μm is formed. This substrate is shown in FIG. 7 as substrate 700. The GaAs substrate 700 is preferable semi-insulating by virtue of being doped to $N=5\times10^{17}$ cm$^3$. Stop etch layer 701 of 300 Å is also formed at step 601, covered by a 0.5 μm contact layer 701a formed at step 601a.

At step 602, molecular beam epitaxy ("MBE") is used to form first a 500 Å barrier layer of $Al_xGa_{1-x}As$ layer 702 on the GaAs bottom contact layer 700. The layer 702 preferably has a thickness of 300–500 Å. This is followed by step 604 in which molecular beam epitaxy is used to form a 45 Å well 704 of GaAs. This process continues until 50 periods are formed. Each period so formed includes both a barrier and a well. One more barrier of undoped $Al_xGa_{1-x}As$ needs to be formed at step 605. Top contact layer 708 of GaAs is between 0.1–0.5 μm thick and appropriately doped.

The entire device may then be covered by another 300 Å stop-etch layer 712 which is grown in situ on top of the device structure. This stop-etch layer 712 is formed of $Al_{0.3}Ga_{0.7}As$. The stop-etch layer 712 is then covered by a 0.7 micron thick GaAs cap layer acting as a λ/4 phase shift layer. The stop-etch layer and cap together form the light coupling optical cavity.

Figure 7A:
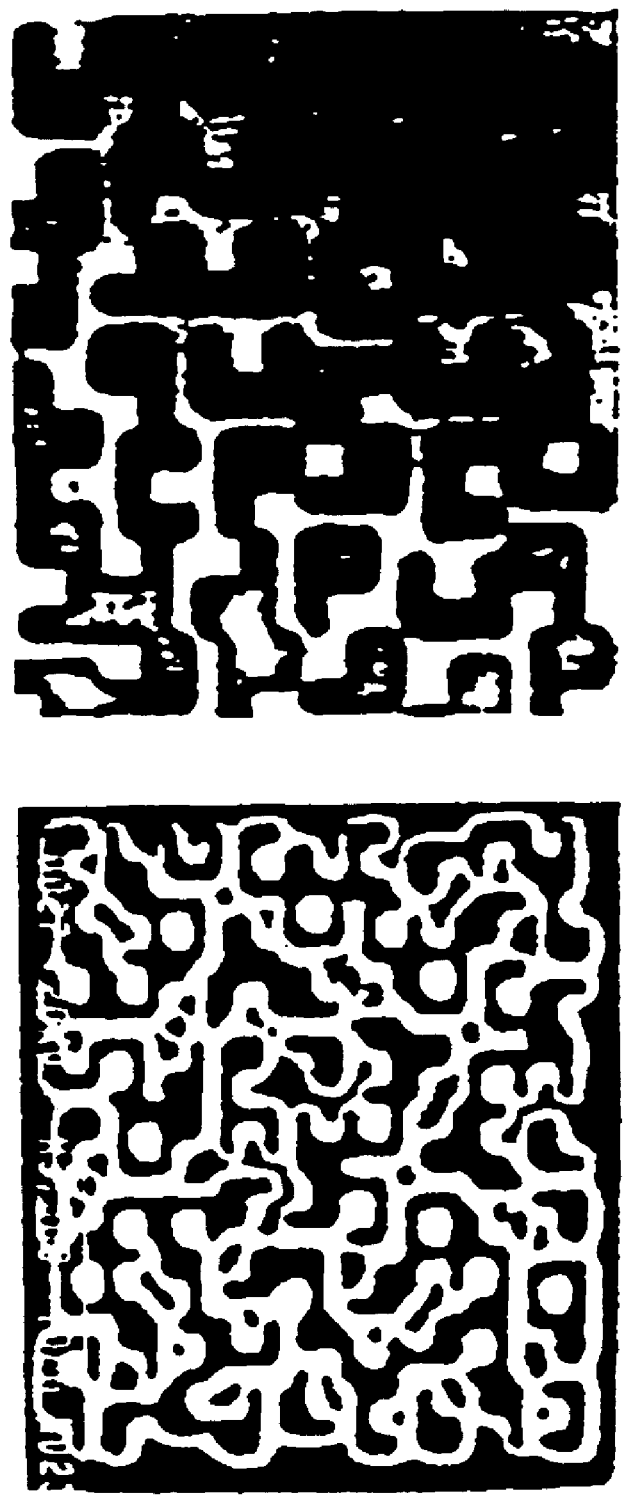
FIG. 7A shows pictures of the random reflectors which are preferably used according to this invention.

At this point the structure is processed into a mesa area using wet chemical etching at step 610. Gold/germanium contacts are evaporated onto the top and bottom contact layer at step 612. Submicron photolithography is used to form random reflectors as described herein and as shown in FIG. 7A.

The resulting device is a 256×256 QWIP focal plane array ("FPA"). The FPA has a 38 micron pitch with an actual pixel size of 28×28 square microns. Random reflectors are formed on top of the detectors and are covered with gold/germanium and gold for ohmic contact and reflection. Indium bumps are evaporated on top of the reflectors for readout circuit hybridization.

Figure 8:
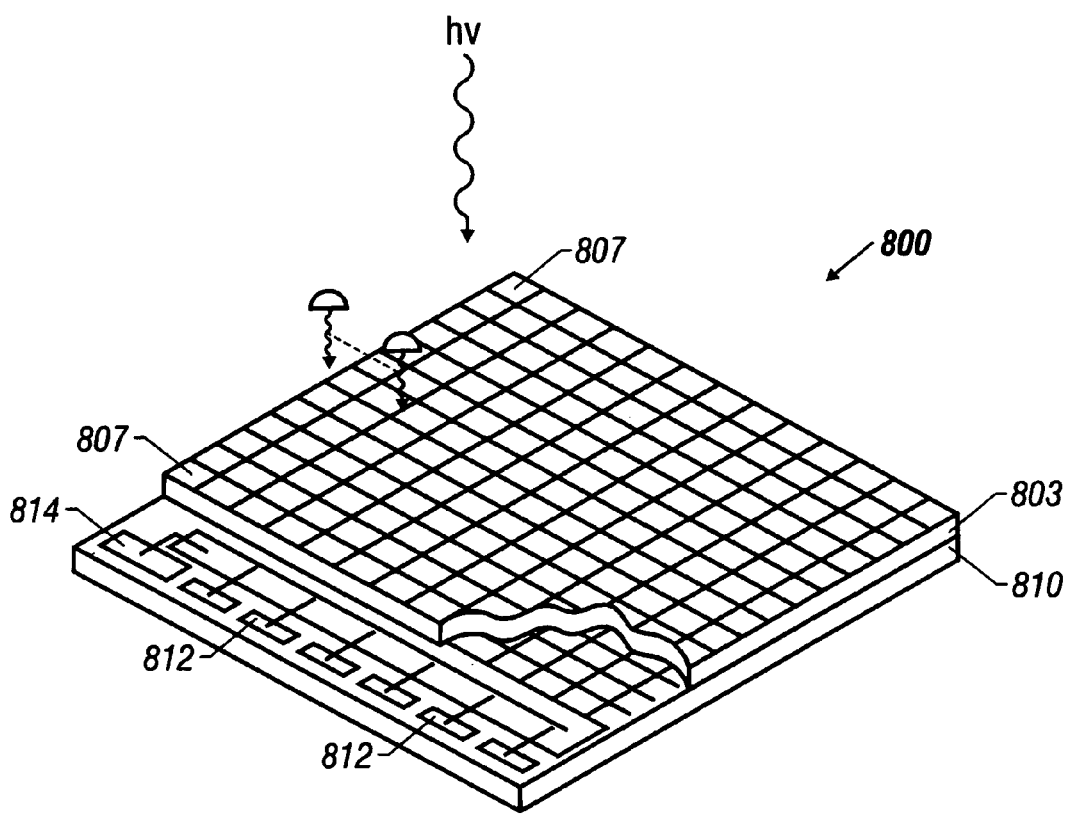
FIG. 8 shows a QWIP array.

FIG. 8 shows a two-dimensional QWIP/silicon CMOS multiplexer hybrid detector 800 for generating two-dimensional infrared images. The hybrid detector 800 has a two-dimensional QWIP array 803 electrically connected to a two-dimensional CMOS multiplexer substrate 810. Both the QWIP array 803 and CMOS multiplexer substrate 810 have a 256×256 array of pixels. Each pixel 807 has a single QWIP similar to that described above. A gold, roughened, random reflecting surface such as discussed in respect to FIG. 7 is formed on the top of the detectors to facilitate absorption of normally incident radiation. Each pixel within the QWIP array 803 is attached to a matching pixel in the CMOS multiplexer substrate 810 by an indium bump.

Figure 9:
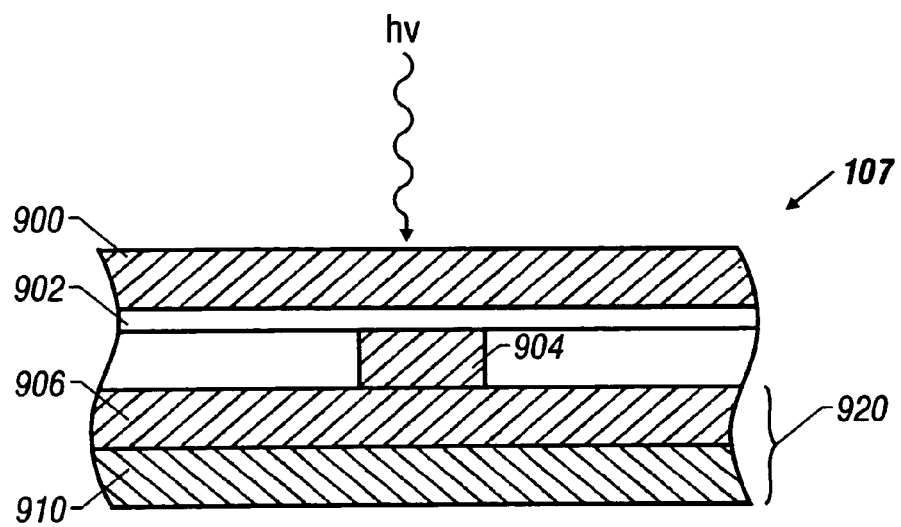
FIG. 9 shows a cross section of the QWIP array along the line 9—9 in FIG. 8.

FIG. 9 is a cross sectional side view of a single pixel 107 of the hybrid detector 100 of FIG. 8. A single QWIP 900 within the pixel has a quantum well structure and electrical contact layers grown on top of a GaAs substrate. A roughened, random reflecting layer 902 is attached to the bottom surface of the QWIP 900 after the GaAs substrate is thinned (described below). The QWIP 900 and reflecting layer 902 are attached via an indium bump 904 to underlying CMOS circuitry 906. The CMOS circuitry 906 is attached to a portion of a silicon substrate 910. Together, the CMOS circuitry 906 and portion of the silicon substrate 910 represent a single pixel 120 of the CMOS multiplexer. This pixel 920 is spatially aligned with the QWIP 900 so that photocurrent generated by the quantum well structure can be detected and processed to form a two-dimensional image.

Figure 10:
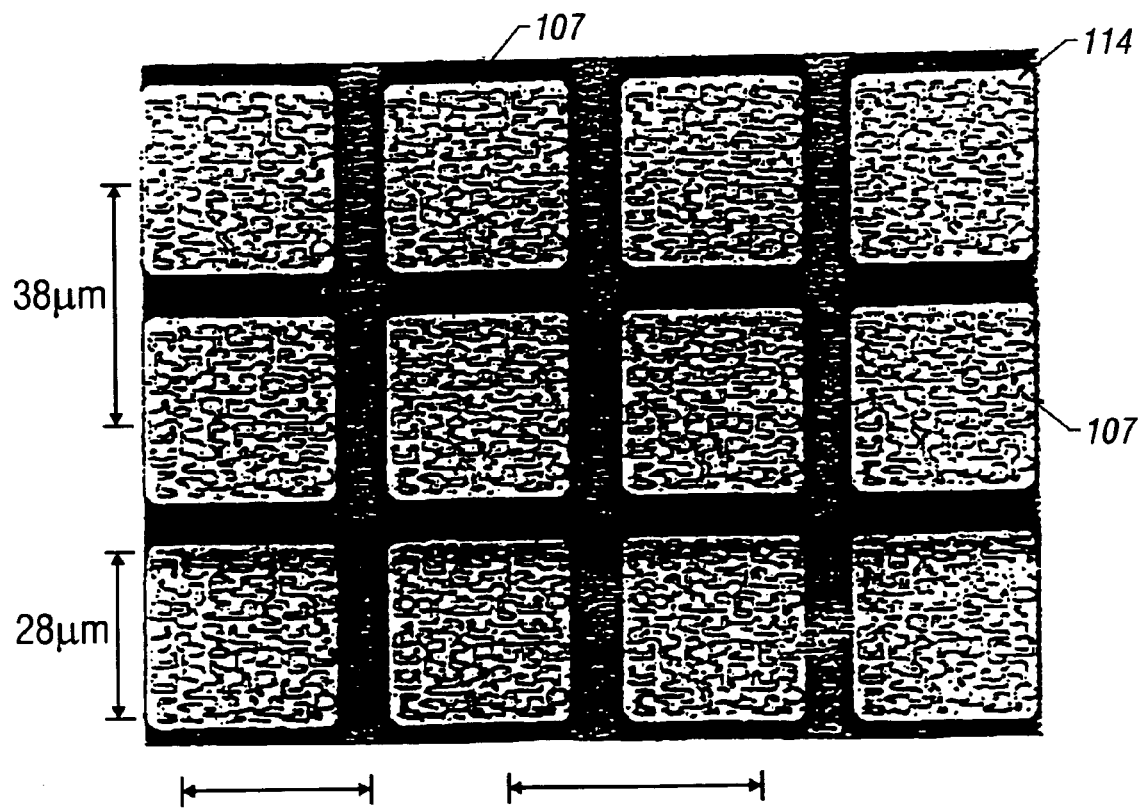
FIG. 10 shows a plan view of multiple pixels of the QWIP array.

FIG. 10 is a drawing of the bottom surfaces of twelve pixels of a camera. This shows the random, roughened reflecting layers 114. Individual pixels have an area of 28 μm×28 μm. The center-to-center separation distance between the pixels is 38 μm.

As described above, random reflectors have demonstrated excellent optical coupling for individual QWIPs. However, the light coupling efficiency of such a random reflector is independent of wavelength because of the random nature of the reflector. The random reflectors essentially exhibit a wideband spectral response.

The inventors have recognized that since an optical coupling mechanism is necessary, there are times at which it may be desirable to filter the passband of the light using the optical coupling mechanism.

The embodiment of FIG. 10 employs a special cross-grating in which the coupling efficiency is wavelength-dependent due to the periodicity of the cross-gratings. This cross-grating light technique enables a narrow-bandwidth high-efficiency QWIP focal plane array.

Figure 10A:
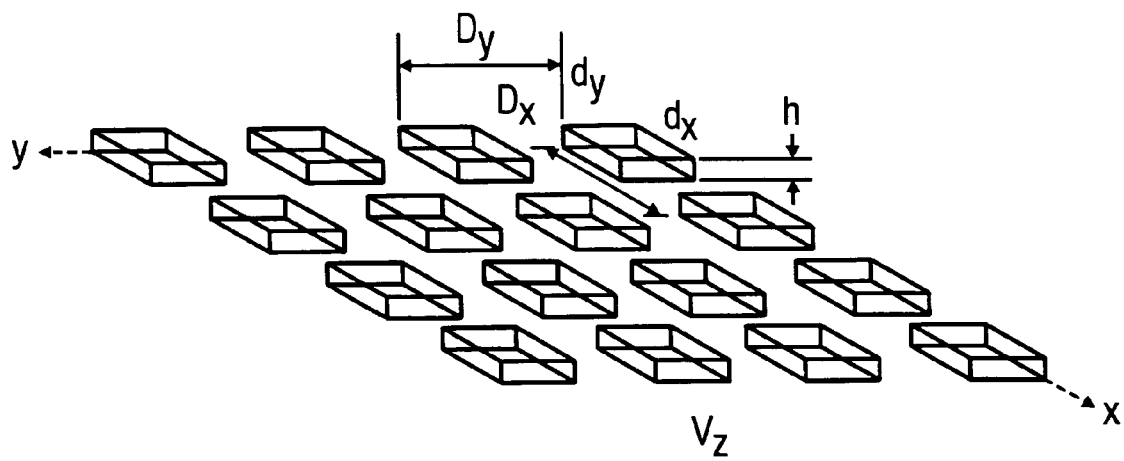
FIG. 10A shows a preferred grating structure of an embodiment.
Figure 10B:
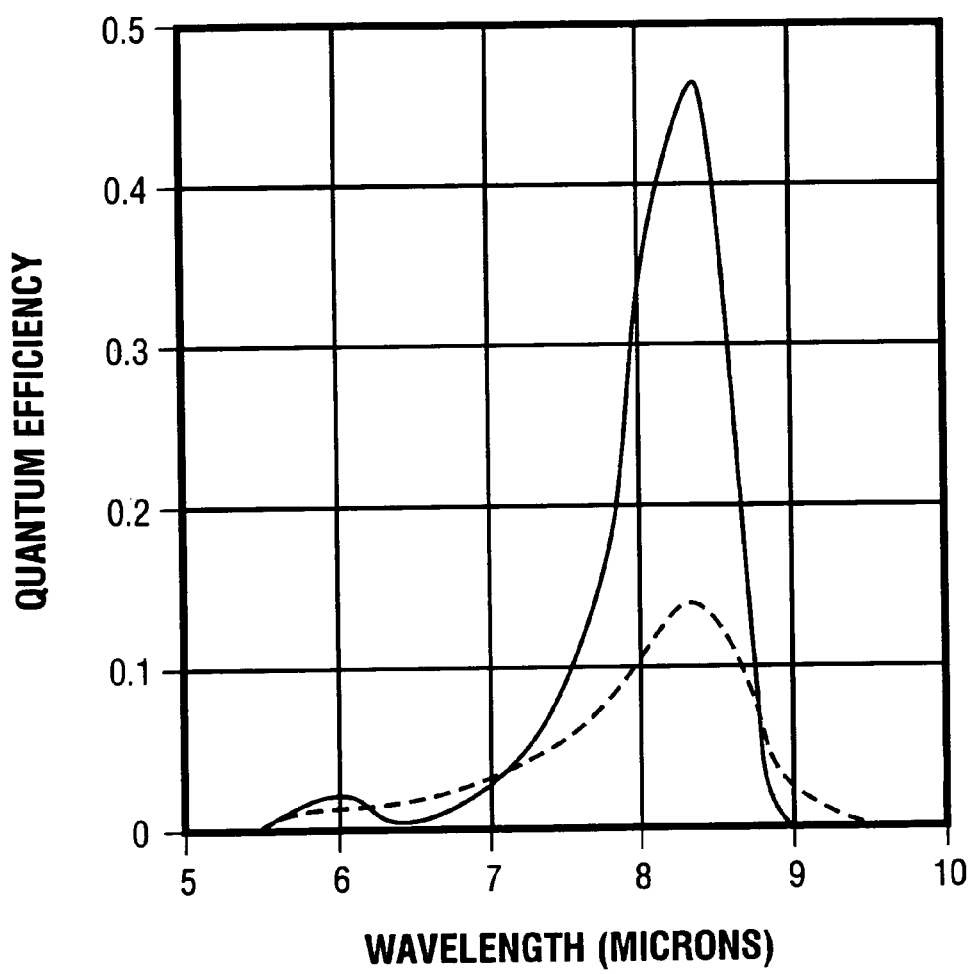
FIG. 10B shows the frequency response of the grating structure of FIG. 10A.

FIG. 10A shows a detailed view of the grating structure, and FIG. 10B shows the quantum efficiency of this grating. Note that this grating has a strong peak wavelength at 8.5 $\mu$m. The optimized grating parameters for any grating can be obtained from trial and error, or by calculating the wave amplitudes of the electric and magnetic field vectors between the boundary z=0 plane.

The bound-to-quasibound quantum well structures described above are fabricated by growing alternating GaAs and $Al_xGa_{1-x}As$ layers on a 3-inch GaAs wafer. Each layer is grown using molecular beam epitaxy ("MBE") according to standard, well-known techniques in the art. A doped stop-etch layer is grown on the wafer prior to growing the QWIP. Additional layers are then evaporated on the bottom electrical contact layer and patterned using photolithography and selective dry etching. Photolithography and wet chemical etching are then used to pattern the two-dimensional QWIP array.

The GaAs wafer is diced to form individual GaAs substrates, each containing a two-dimensional QWIP array. The patterned surface of the GaAs substrate is attached to the CMOS multiplexer using an indium bump.

It is usually desirable to minimize pixel-to-pixel crosstalk and thermal mismatches between the focal plane array and the readout multiplexer while maximizing light coupling efficiency. The inventors have used a technique herein called thinning. The technique of this embodiment preferably thins the QWIP focal plane array virtually to the thickness of a membrane. The thin membranes which remain have very small thermal mass that functions to significantly reduce or avoid thermal mismatch. Thinning to the membrane level also maximizes the width to height aspect ratio. This maximizes coupling efficiency from random reflectors. The minimal substrate that remains after the thinning typically attenuates pixel cross-talk.

An important feature of the thinning process of the present invention is growing the whole QWIP device on top of a 300 Å $Al_{0.3}Ga_{0.7}As$ layer. $CCl_2F_2$ selective dry etching is used to remove the last few microns of the GaAs substrate from the QWIP devices. The entire process employs thinning by mechanical polishing followed by non-selective wet etching and selective dry etching.

Gaps between the QWIP array and the multiplexer substrate are filled with an epoxy to solidify the hybrid detector. The connected pixels are also electrically connected to row and column-processing electronics 812 and image-processing electronics 114 situated on the hybrid detector 100.

Figure 11:
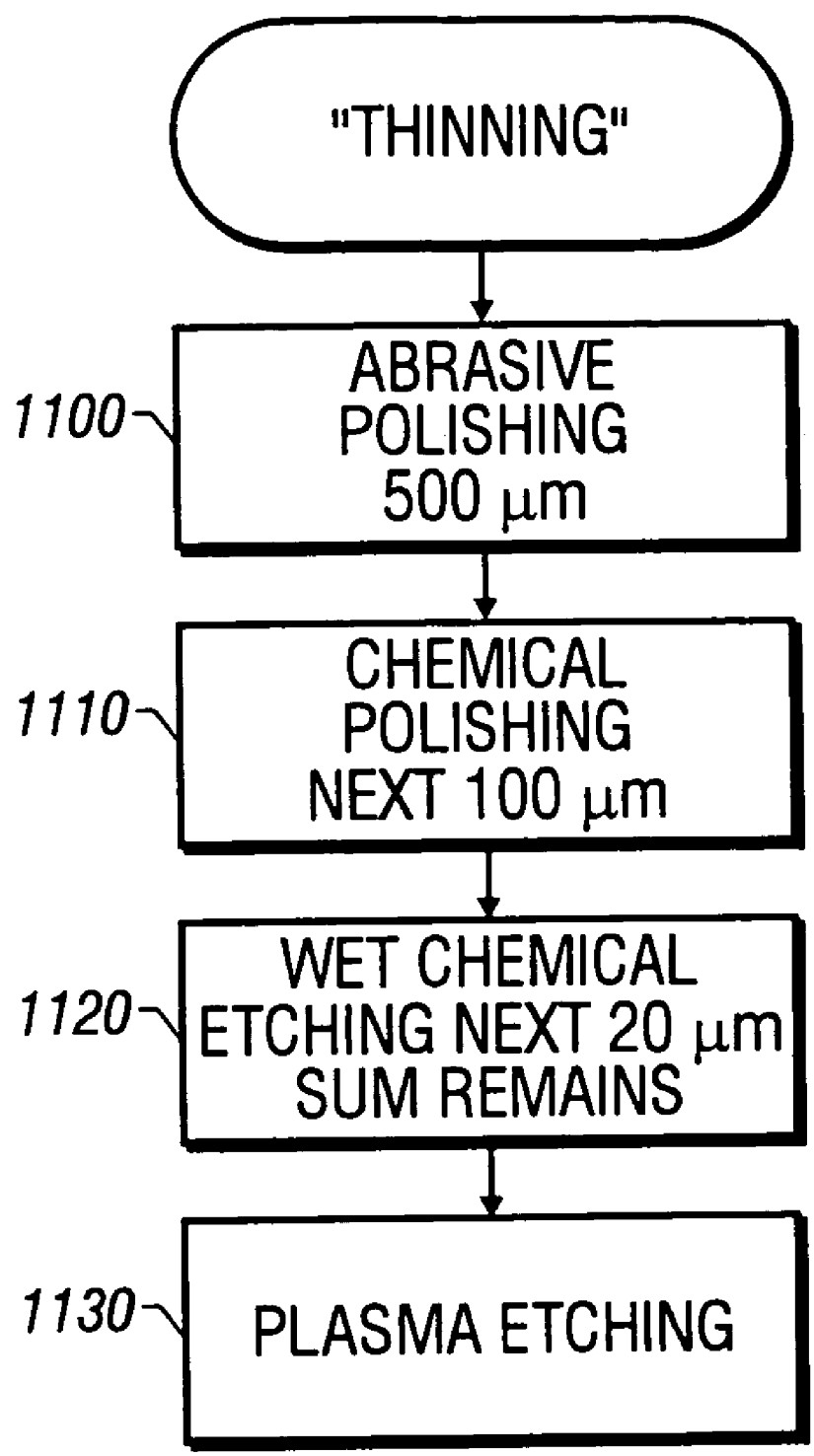
FIG. 11 shows a flowchart of the thinning process preferably used with the invention.

FIG. 11 shows a flowchart diagraming the details of the thinning process. Abrasive polishing 1100 is used to remove the first 500 $\mu$m of the substrate. The polishing can be done by attaching the CMOS chip to a glass microscope slide and rubbing the GaAs substrate against an abrasive plate treated with $Al_2O_3$ and water.

A chemical polishing process 1110 removes the next 100 $\mu$m from the GaAs substrate. This process includes exposing the substrate to a bromine:methanol solution present in a ratio of 1:100.

Wet chemical etching 1120 is then used to remove the next 20 $\mu$m from the substrate. In this step, all outer surfaces of the QWIP photodetector except for the GaAs substrate surface are covered with a standard photoresist. The substrate surface is then exposed to an $H_2SO_4:H_2O_2:H_2O$ solution (5:40:100). The etch rate using this solution is approximately 1.7 to 1.8 $\mu$m/minute.

The wet chemical etching 160 is continued until about 5 $\mu$m of the GaAs substrate remains. The detector is then dipped into a 5% HCl/deionized water solution for about thirty seconds, blown dry, and loaded into a plasma etching chamber. This plasma etching 1130 is used to remove the substrate at a rate of approximately 1.2 $\mu$m/minute until the stop-etch layer is reached. Plasma etching 160 requires evacuating the chamber to a pressure of about 1×10−−6 torr. $CCl_2F_2$ is then introduced into the chamber until the pressure reaches 100 torr. The substrate is biased at 100W and 45V in the chamber. The substrate is removed from the chamber when the stop-etch layer is reached. Residual materials present on the substrate are easily removed with an $O_2$ plasma.

This leaves about 300 Å of the stop-etch layer and about 1000 Å of the contact layer. This 1300 Å layer has almost no thermal mass, and hence even if cooled to 70° K permits very little thermal mismatch. This thin layer also improves the optical coupling efficiency and prevents crosstalk as described above.

Another aspect of present invention is the reduction of the fundamental bulk dark current. The fundamental dark current of the QWIP is proportional to the area of the device. This compares with the surface leakage current which is proportional to the circumference. The surface leakage current to bulk dark current ratio therefore increases with decreasing detector size. The surface leakage current contribution into the total noise current of the detector of a large area focal plane is high—e.g., 400% in a typical QWIP.

The present invention reduces the surface leakage current by a special method described herein. As described above, the fundamental dark current of the QWIPs is due to sequential tunneling, thermionic assisted tunneling, and thermionic emission. At higher operating temperatures (i.e., T 50° K for 10 $\mu$m device) thermionic emission dominates the dark current.

Infrared detectors in focal plane arrays are typically around 40×40 $\mu m^2$. The surface current to total dark current ratio for a 40×40 $\mu m^2$ QWIP device can be estimated as around 400%. This tremendous increase in the surface current contribution to the total dark current of a small area device is due to the surface area reduction being much more rapid than the circumference reduction of the device.

The parasitic surface-induced leakage can be reduced significantly by treating the open surfaces with classes of inorganic sulfides as $LiS_2$, $(NH_4)S$, $Na_2S.9H_2O$, etc. or using $NH_4OH$ wet chemical etch to define the mesa and passivating the open areas with SiN. Therefore, $NH_4OH$ base enchant to define the QWIP mesas and SiN passivation has previously increased the QWIP dark current. This reduction in dark current increases the sensitivity of the QWIP focal plane arrays by 200%.

OTHER EMBODIMENTS

Other embodiments are within the scope of the invention. Importantly, the present specification has described operation with the photocarriers being electrons. The operation could also work analogously with holes forming the photocarriers.

Semiconducting materials other than GaAs and $Al_xGa_{1-x}As$ can also be used to fabricate bound-to-quasibound quantum well structures. Such structures can include, for example, $In_yAl_{1-y}As/In_xGa_{1-x}As/In_yAl_{1-y}As$, $InP/In_xGa_{1-x}As/InP$, $InP/InGaAsP/InP$, $Ga_xIn_{1-x}P/GaAs/Ga_xIn_{1-x}P$, $Al_xIn_{1-x}P/GaAs/Al_xIn_{1-x}P$, and $GaAs/In_xGa_{1-x}As/GaAs$ materials. In all cases, the quantum well parameters (i.e., well depth and width) are varied by adjusting the stoichiometric ratios and thicknesses of the materials so that a bound-to-quasibound energy level configuration exists.

The GaAs and $Al_xGa_{1-x}As$ QWIP described above has a sensitivity peaked at 8.5 μm in the infrared spectral region. It is also possible to fabricate bound-to-quasibound quantum well structures which absorb photons in different regions of the infrared spectrum. For example, the materials used in the quantum well and barrier layers can be, respectively, $Al_yGa_{1-y}As$ and $Al_zGa_{1-z}As$. The mole fractions of Al (i.e., y and z) are then adjusted to form the bound-to-quasibound quantum well structure having the desired well depth. The thickness of the GaAs well layer can also be changed to achieve a different spectral response.

Different quantum wells within a single QWIP FPA can also have different absorptive properties. This effectively broadens the spectral response of the QWIP FPA and makes for a more robust detector. In one embodiment, barrier layers of $Al_xGa_{1-x}As$ separate alternating well layers of GaAs and $Al_yGa_{1-y}As$. Quantum wells defined by $Al_xGa_{1-x}As$: $Al_yGa_{1-y}As$:$Al_xGa_{1-x}As$ where x is 0.3 have bound-to-quasibound energy levels and absorb radiation at a first wavelength (i.e., 10.5 microns). Quantum wells defined by $Al_xGa_{1-x}As$:GaAs:$Al_xGa_{1-x}As$ where x is 0.3 absorb radiation at a second wavelength (i.e., 8.5 microns). The distribution of these quantum wells within the quantum well structure can be either random or periodic. Alternatively, absorption in different spectral regions is achieved with quantum well structures having individual quantum wells made from the different types of materials described above.

In addition, other materials in the QWIP, such as the electrical contact, reflecting, and stop-etch layers, can be substituted for or doped differently to achieve a similar electrical function. For example, the random reflecting layer used to generate angled, internal reflections within the quantum well structure can be replaced by diffraction gratings or similar optical structures which diffract or reflect radiation. Diffraction gratings are desirable in some applications because they exhibit wavelength-dependent diffraction. These structures can therefore be used to narrow the spectral response of the QWIP.

Other embodiments of the thinning process can also be used to fabricate the QWIP. For example, the steps of the method can be varied to remove amounts of the substrate other than those described above. Similarly, the chemicals used for the wet and plasma etching processes can be substituted with other suitable chemicals.

Two-Color OWIP FPAs

Figure 12:
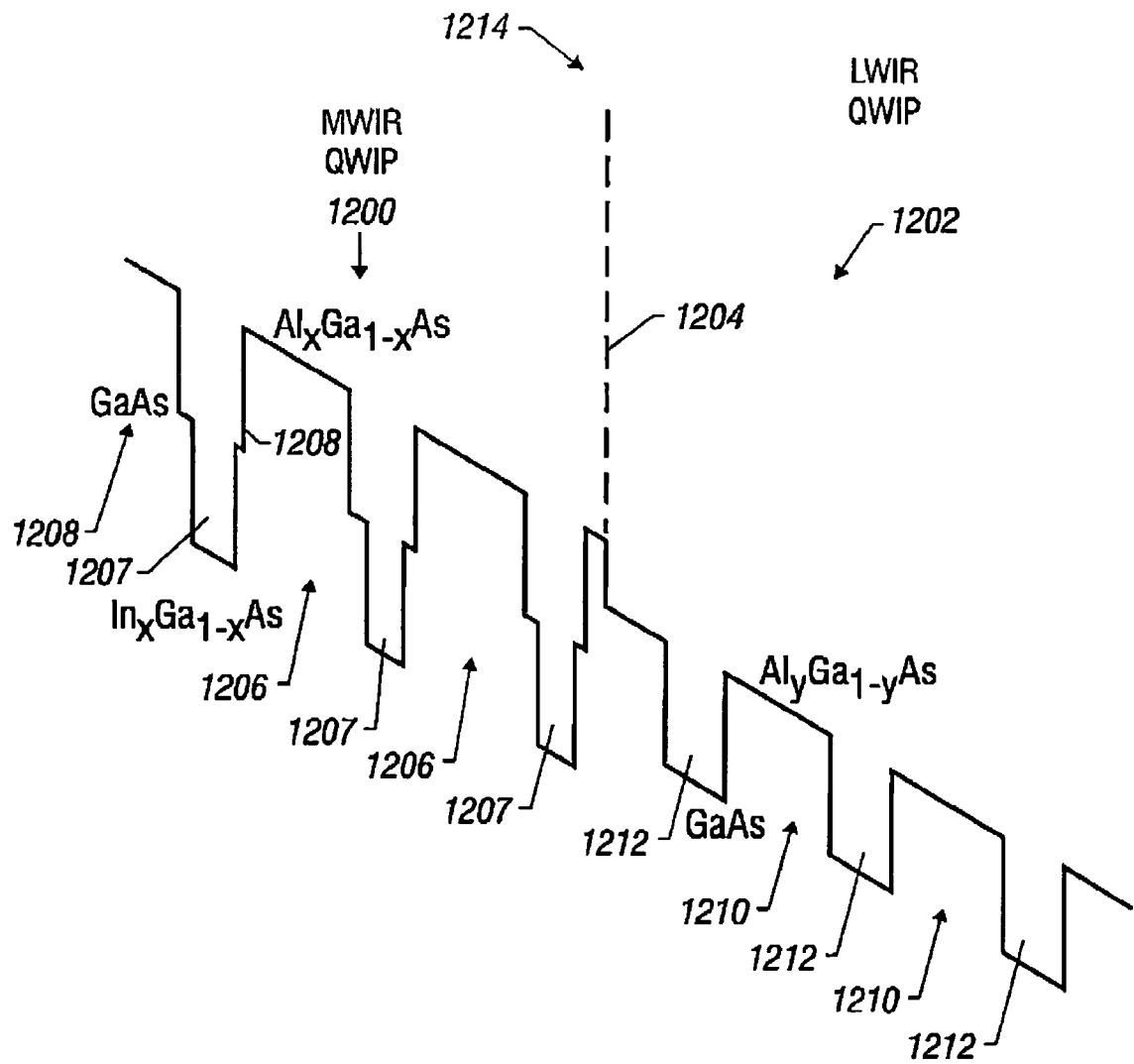
FIG. 12 shows the conduction band energy diagram of a bound-to-quasibound two-color QWIP of the first and second embodiments of the invention.
Figure 13:
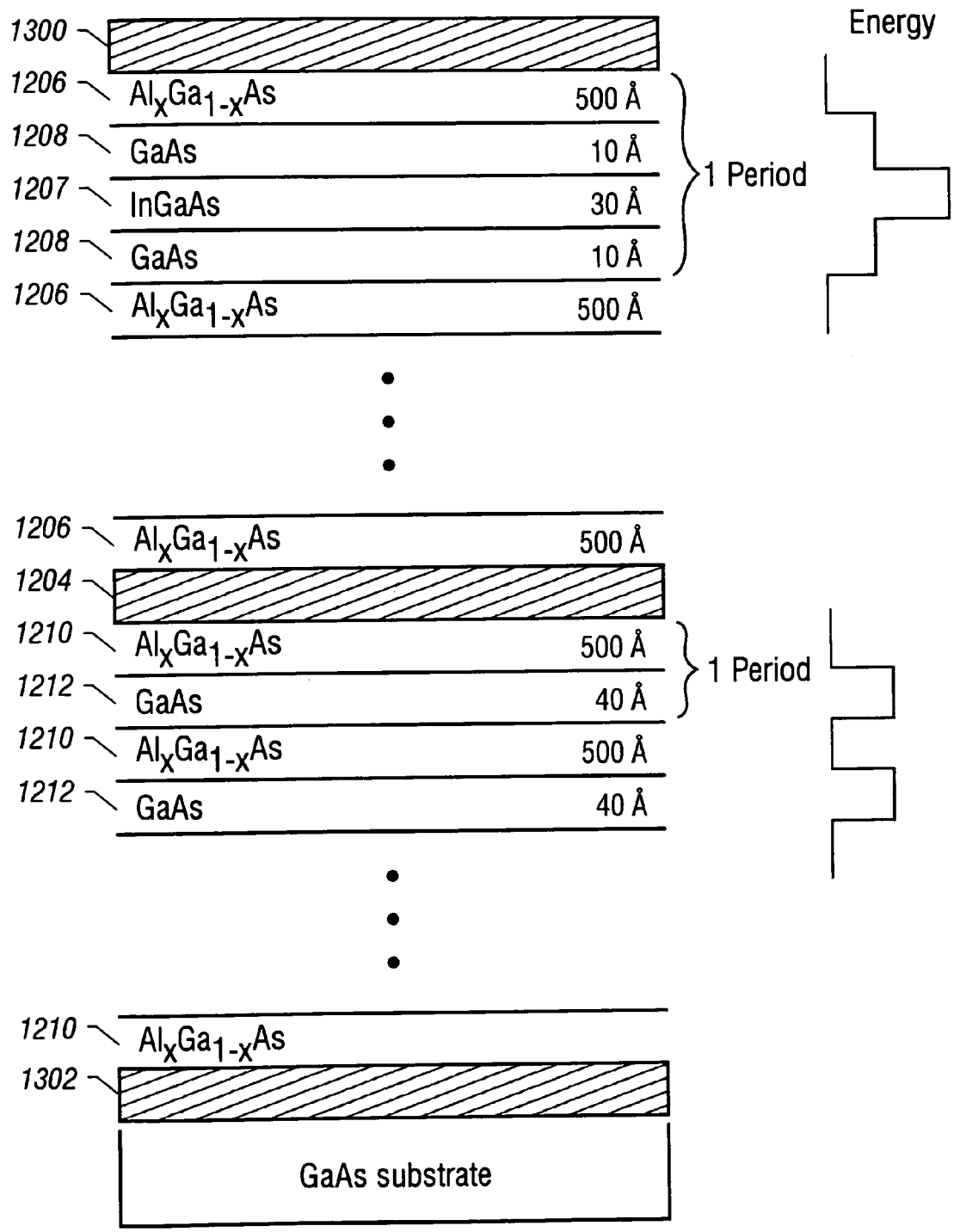
FIG. 13 shows the layers forming the two-color QWIP of the first and second embodiments of the present invention.

FIGS. 12–22 show three different embodiments of QWIP FPAs configured to detect two different wavelengths. FIG. 12 shows a schematic conduction band diagram of a bound-to-quasibound QWIP 1214 used in a two-color FPA in the first and second embodiments of the present invention. FIG. 13 shows the layers forming the two-color QWIP of the first and second embodiments. Each pixel in the two-color QWIP FPA includes 20–50 periods of alternating quantum wells. This includes a stack of 10–25 periods of mid-wavelength infrared (MWIR) QWIPs 1200 and another stack of 10–25 periods of long wavelength infrared (LWIR) QWIPs 1202. The MWIR and LWIR QWIPs 1200 and 1202, are separated by a heavily doped intermediate GaAs contact layer 1204. The MWIR QWIPs 1200 includes 10–25 periods of 500 Å $Al_xGa_{1-x}As$ barrier 1206 and a narrow $In_xGa_{1-x}As$ well 1207 sandwiched between two thin layers of GaAs 1208. This MWIR QWIP structure 1200 preferably is configured to have a peak wavelength of 4.5 μm. The second (LWIR) QWIP 1202 includes 10–25 periods of 500 Å $Al_xGa_{1-x}As$ barrier 1210 and a 40 Å GaAs well 1212. This LWIR QWIP 1202 structure preferably is configured to have a peak wavelength of 9 μm.

The entire structure of the two-color 50 period QWIP 1214 is sandwiched between top and bottom contact layers 1300 and 1302. In a preferred embodiment, the top and bottom contact layers 1300 and 1302 are 0.5 μm GaAs doped n=5×10$^{17}$ cm$^{-3}$. The top and bottom contact layers 1300, 1302 are preferably grown on the semi-insulating GaAs substrate by molecular beam epitaxy (MBE).

Figure 14:
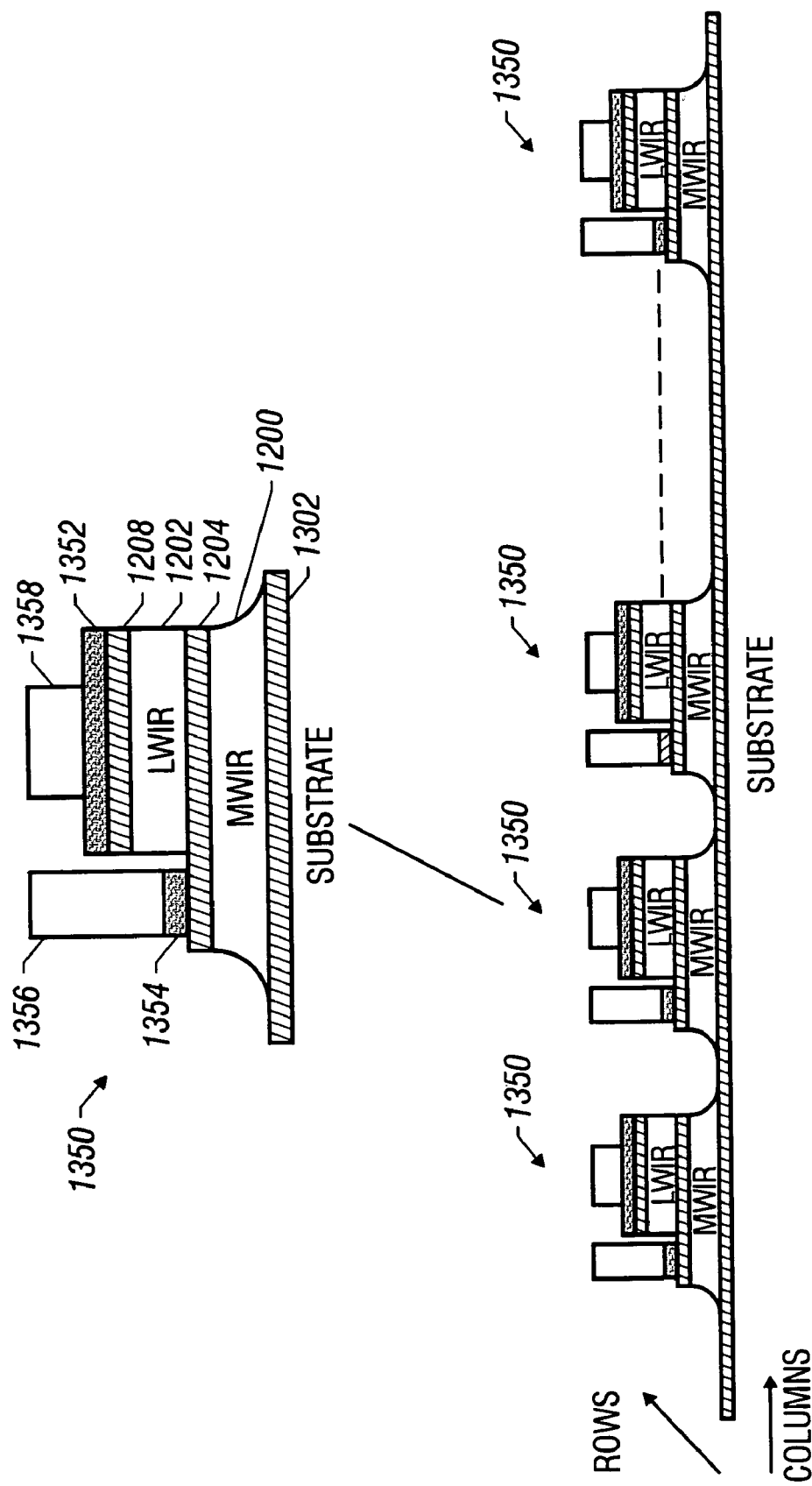
FIG. 14 shows a cross-sectional view of a QWIP for a first embodiment of the invention.

FIG. 14 shows a cross-sectional view of a QWIP 1350 of the first embodiment of the invention. This embodiment includes substrate 1302, contact layer 1204 and GaAs layers 1208. Also, an LWIR stack 1202 and an MWIR stack 1200 are shown. A metal contact layer 1352 is disposed on top of the LWIR stack and a second metal contact 1354 is formed on top a portion of the MWIR stack 1200 which protrudes adjacent to the LWIR stack. A pair of indium bumps 1356 and 1358 are disposed on top of the respective metal contacts 1352 and 1354. Identical QWIP structures 1350 are arranged in columns and rows, one per pixel, as shown in FIG. 14.

In this embodiment, it is possible to read out both LWIR and MWIR outputs simultaneously by electrically addressing the indium bumps individually. This may be done using a hibridized multiplexer such as the multiplexer 810 shown in FIG. 8. Also, since each pixel is used for both colors, there is full spatial resolution.

FIGS. 15A–C show cross-sectional views of a single pixel two-color QWIP 1400 in accordance with the second embodiment of the invention. The QWIP 1400 includes an LWIR stack 1202 and an MWIR stack 1200 separated by an intermediate contact layer 1204. A 1.0 μm thick GaAs cap layer 1300 is formed on top of the MWIR QWIP structure 1200. This cap layer 1300 is grown in situ on top of a 300 Å AlGaAs stop-etch layer (not shown) to fabricate a light coupling optical cavity. An indium bump 1404 is placed on top of the cap layer 1402 which will be used to hybridize a CMOS multiplexer using an indium bump-bonding process. FIGS. 15A–B also show the lower contact layer 1410 and a GaAs substrate 1412.

During the metalization process, the MWIR QWIPs 1200 in odd rows of the FPA are short-circuited as shown at 1406. As a result, only the LWIR QWIPS 1202 will be operational in the odd rows of the FPA. Similarly, LWIR QWIP pixels which are on even rows of the FPA will be short-circuited as indicated at 1408. As a result, only the MWIR QWIPs will be operational in even rows.

FIG. 15C shows a single column 1500 of two-color QWIP FPA pixels. The first pixel 1502 is similar to the pixel shown in FIG. 15A with the MWIR QWIPs shorted and only the LWIR QWIPs operational. The pixel 1504 in the second row is the same as the pixel shown in FIG. 15B, hence the LWIR QWIPs are short-circuited and only the MWIR QWIPs are operational. As a result, all of the pixels 1502 in the odd rows will be primarily responsive to LWIR. All of the pixels 1504 in the even rows will be primarily responsive to MWIR. At the end of the column a row of pixels 1506 have both the MWIR and LWIR contacts shorted to provide a bottom contact. The bottom contact is used to provide a conductive path for read out. It should be noted that in the second embodiment in FIG. 15, only half of the QWIP structures are used. This reduces the spatial resolution by one half. In the first embodiment shown in FIG. 14, spatial resolution is not reduced since all of the pixels are used.

A hybridized multiplexer, such as the multiplexer 810 shown in FIG. 8, is attached to the QWIP pixel at the indium bump 1404 via an indium bump-bonding processes. The multiplexer 803 is configured to read alternate rows of the FPA to produce separate MWIR and LWIR images of the same field of view.

Figure 16:
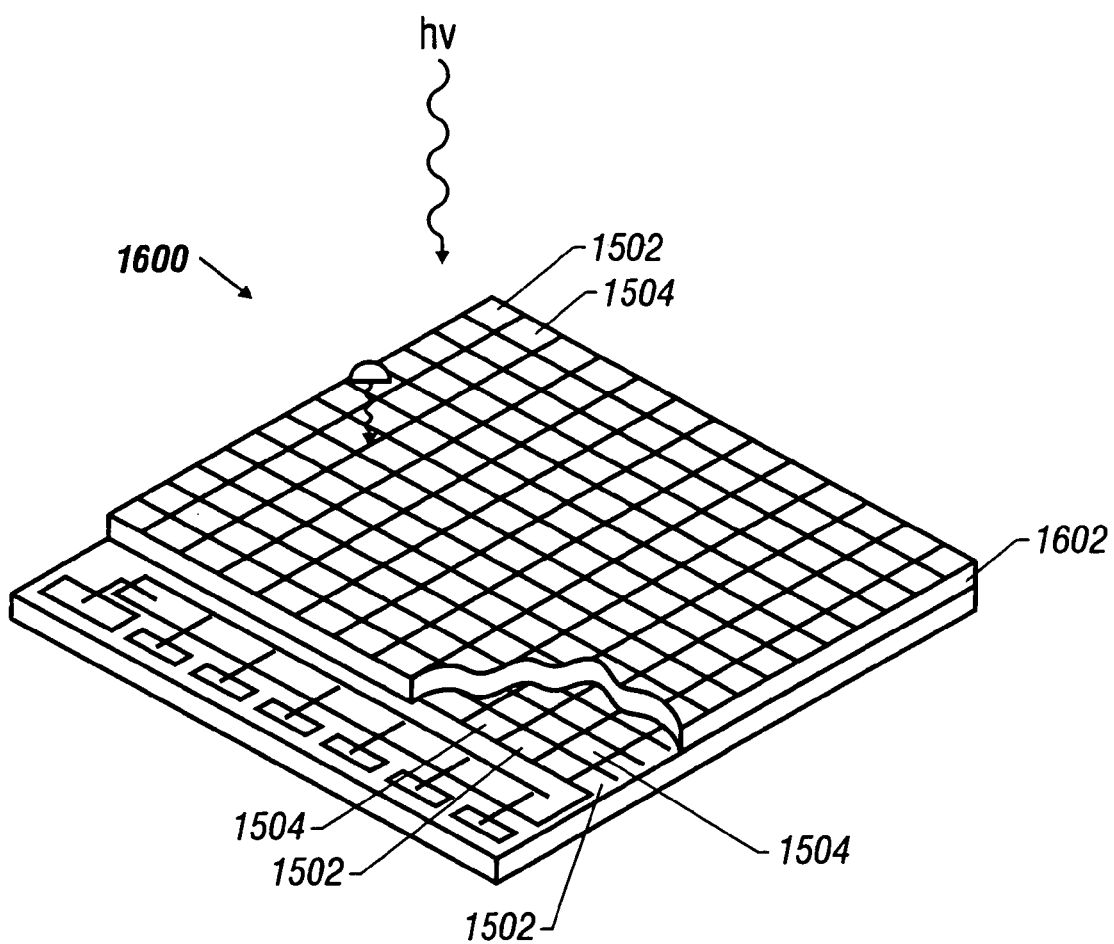
FIG. 16 shows a two-color QWIP FPA of the present invention.

A 640×484 two-color FPA 1600 of one embodiment of the invention is shown in FIG. 16 along with a portion of the hybridized multiplexer 1602. Embodiments one, two and three have all of the features in FIG. 16 in common. LWIR pixels 1502 are in odd rows and MWIR pixels 1504 are in even rows. In the FPA 1600, a random reflector or grating array is defined by lithography and dry etching.

A preferred embodiment of the photoconductor QWIPs shown in FIGS. 13–16 having 640×484 pixels are fabricated as follows. An array of 640×484 MWIR QWIPs are fabricated by wet chemical etching through the first stack of photosensitive $GaAs/In_xGa_{1-x}As/Al_xGa_{1-x}As$ multi-quantum well layers into the 0.5 $\mu$m thick doped GaAs intermediate contact layer 1204. Next, the photoconductive QWIPs of the 640×484 LWIR FPAs 1504 are fabricated by wet chemical etching through the second stack of photosensitive $GaAs/Al_xGa_{1-x}As$ multi-quantum well layers into the 1.0 thick doped GaAs bottom contact layer 1410 on substrate 1412. The pitch of the FPA 1600 is 25 $\mu$m and the actual pixel size is 20×20 $\mu m^2$. The light coupling cavity 1403 on top of the detectors is then covered with Au/Ge and Au for ohmic contact and reflection. In the second embodiment shown in FIG. 15C, the MWIR QWIPs 1502 on all odd rows and LWIR QWIPs 1504 on all even rows of the FPA will be short-circuited during the metalization process.

Indium-bumps 1404 are then evaporated on top of the detectors for Si readout circuit (ROC) hybridization. A single QWIP FPA is hybridized (via indium bump-bonding process) to a 640×484 CMOS multiplexer (Amber-AE-181) and biased at $V_b=-2.0V$. The quantum wells of the MWIR QWIPs will have an order of magnitude higher doping, so that the photon flux of MWIR and LWIR QWIPs will be similar in strength. This is necessary because MWIR photon flux is an order of magnitude smaller than the LWIR photon flux.

In a preferred embodiment the MWIRs 1504 will have a peak wavelength response of 4.5 $\mu$m, and the LWIRs 1502 will have a peak wavelength response of 9.0 $\mu$m. A number of ways can be used to achieve the desired absorptive properties. In general, the quantum well parameters (i.e., well depth and width) are varied by adjusting the stoichiometric ratios and thicknesses of the materials so that a bound-to-quasibound energy level configuration exists. For example, the materials used in the quantum well and barrier layers can be, respectively, $AL_yGA_{1-y}As$ and $AL_zGA_{1-z}As$. The mole fractions of Al (i.e., y and z) are then adjusted to form the bound-to-quasibound quantum well structure having the desired well depth. The thickness of the GaAs well layer can also be changed to achieve a different spectral response.

Figure 17A:
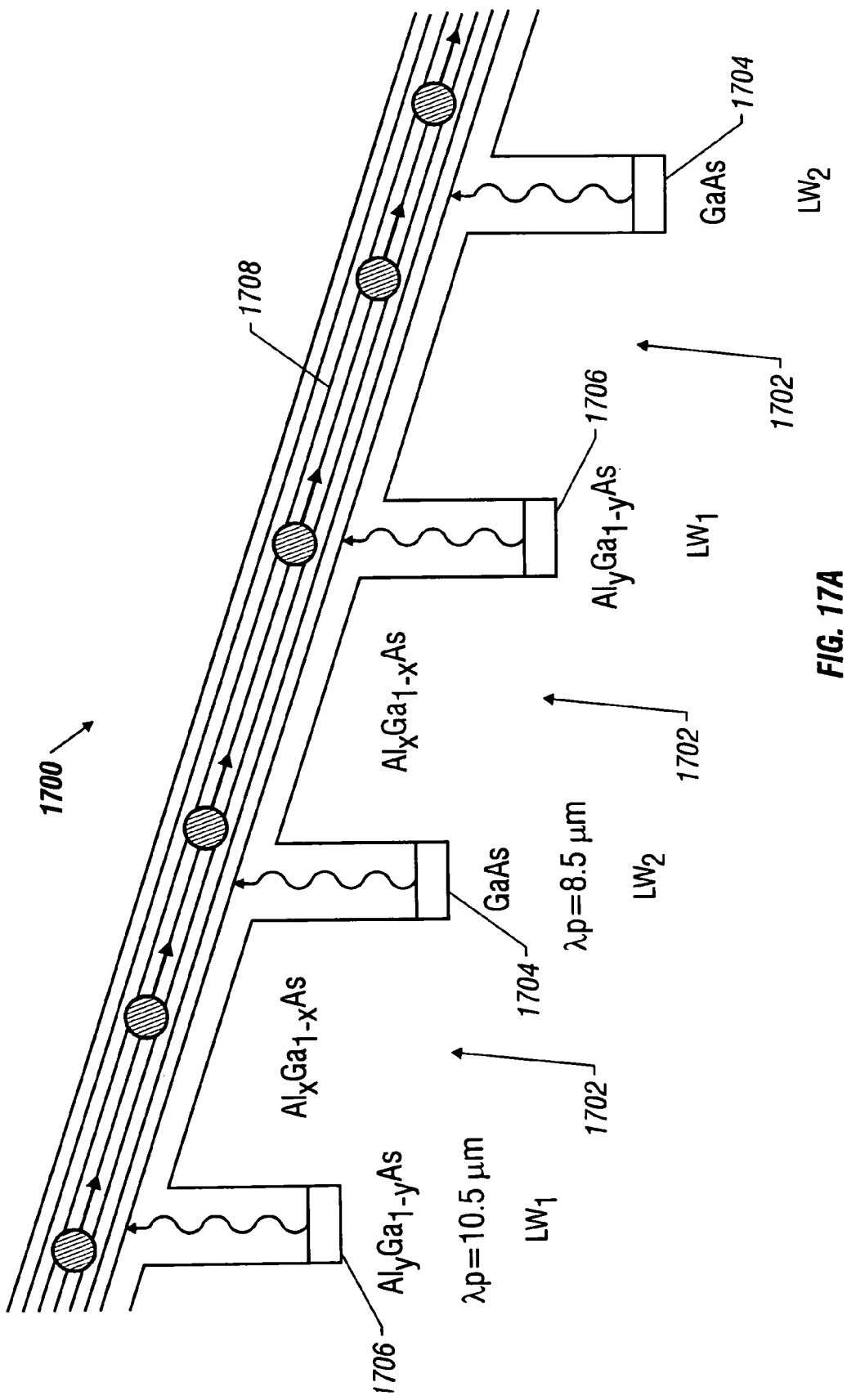
FIG. 17A shows the conduction band energy diagram of a third embodiment of a two-color bound-to-quasibound QWIP of the present invention.

FIG. 17A shows a schematic conduction band diagram of the third embodiment of a two-color bound-to-quasibound QWIP 1700 of the present invention. This embodiment provides a smooth continuum transport band (with no steps) for photoexcited carriers from quantum wells responsive to both wavelengths. In this embodiment, the two wavelengths are two different LWIR wavelengths, such as 8.5 and 10.5 $\mu$m, referred to as $LW_1$ and $LW_2$ respectively.

A smooth continuum transport band is desirable in this embodiment because the two different wavelength QWIP structures are interlaced, in an alternating structure. With the $LW_1$ and $LW_2$ QWIPs next to each other, the smooth conductive band will prevent extra quantum mechanical reflections in the continuum transport band, which would otherwise occur if the transport band abruptly changed. The smooth transport band results from having a uniform barrier height between the different wavelength sensitive QWIPs in the two-color QWIP structure 1700. A uniform barrier height will generally create a smooth continuum transport band. In particular, a smooth continuum transport band is accomplished by using $Al_xGa_{1-x}As$ barriers for both wells and by configuring the GaAs quantum well 1704 and the $Al_yGa_{1-x}$ As quantum well 1706 to have the same barrier height. As a result, the continuum transport band 1708 is smooth across both types of quantum wells 1704, 1706.

Figure 17B:
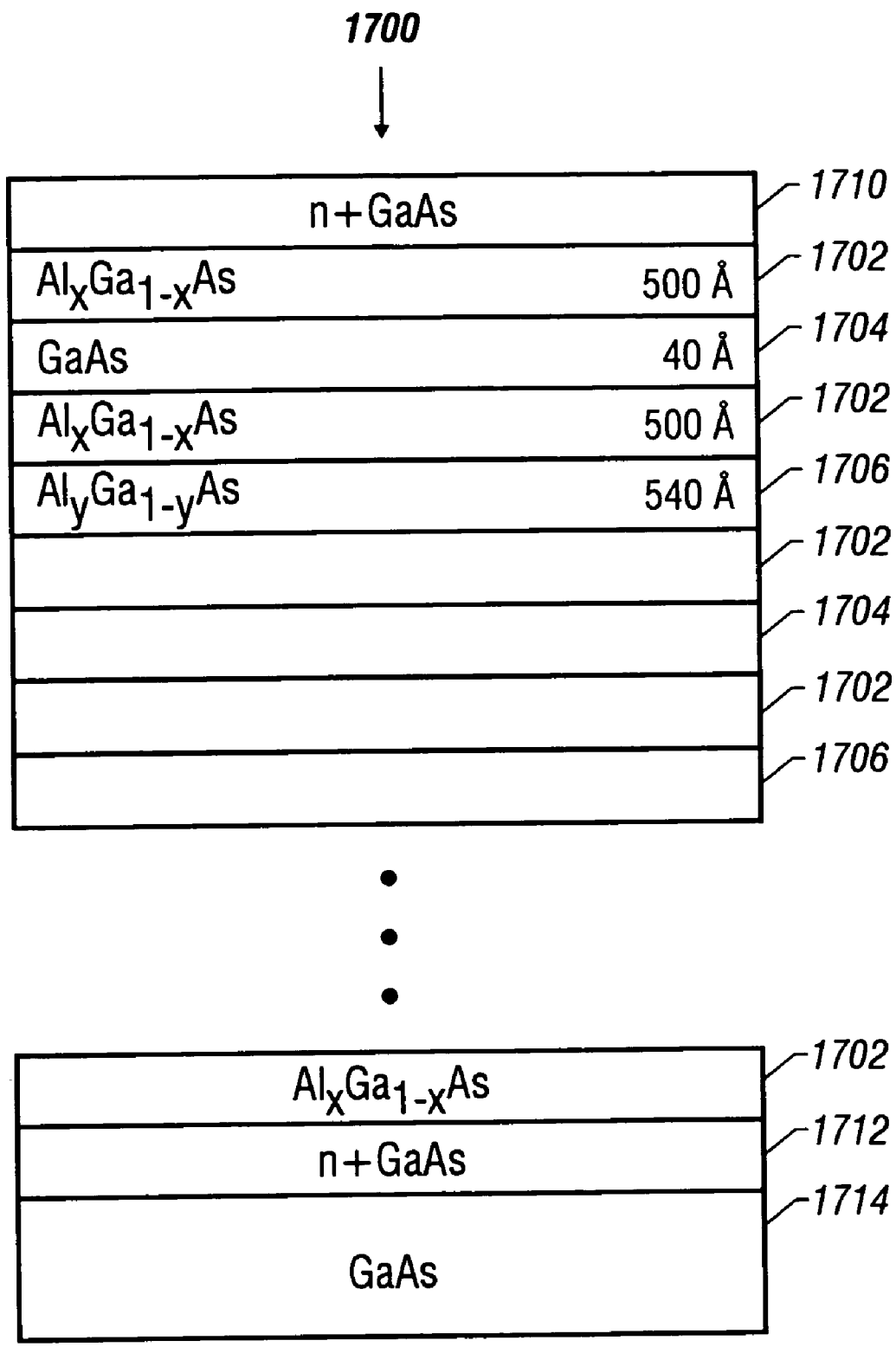
FIG. 17B shows the layers forming the two-color QWIP of the third embodiment of the present invention.

As shown in cross-section in FIG. 17B, the two quantum wells 1704 and 1706 are separated by 500 Å $Al_xGa_{1-x}As$ barriers 1702. Top and bottom contact layers 1300 and 1302 are made of n+ GaAs layers 1710, 1712. The entire structure is fabricated on a GaAs substrate 1714. The FPA array (such as the one shown in FIG. 19 with alternating rows) preferably has QWIPs sensitive to 8.5 $\mu$m and 10.5 $\mu$m, respectively. In the preferred embodiment this is achieved using appropriate well dimensions and with x=0.3 and y=0.02. Of course, absorption in other desired spectral regions can be achieved with quantum well structures having individual quantum well dimensions and materials configured for particular wavelength sensitivity as discussed above.

In accordance with the third embodiment of the two-color QWIP shown in FIGS. 17A–B, the passband of the light entering the two-color QWIP FPA of the invention is filtered using an optical coupling mechanism. This is needed since the different wavelength sensitive QWIP structures cannot otherwise be addressed separately. As discussed above in connection with FIGS. 10A–10B, a special cross-grating may be employed with a coupling efficiency that is wavelength dependent due to the chosen periodicity of the cross-gratings. This cross-grating technique results in a narrow-band high-efficiency QWIP focal plane array. Techniques for optimizing grating parameters are used in the present two-color QWIP FPA embodiment to provide a cross-grating with peaks at both of the desired wavelengths.

While grating parameters can be optimized using trial and error it is preferable to optimize the grating parameters for the desired wavelengths by calculating the wave amplitudes of the electric and magnetic field vectors between the boundary z=0 plane. FIG. 18 shows a two-dimensional grating 1800 which is used for spectral selectivity on alternating columns of detectors in the FPA 1600 shown in FIG. 16.

FIG. 18 is a schematic of the cross-grating 1800 along with a definition of the incident radiation. The cavities of the FPA are spaced periodically along the x and y directions as shown. A circle 1802 drawn perpendicular to the incident wave vector k represents the plane of the electric and magnetic fields. The polarization angle E is measured from the diameter which intersects the z-axis. The quantum mechanical selection rules for infrared intersubband transition require a component of the optical electric field along the quantum well growth direction. Therefore, QWIPs do not respond to normal incident light and hence QWIPs in a large two-dimensional FPA require an optical coupling mechanism to couple the normal incident light into individual detectors. Random reflectors, such as those shown in FIG. 10, demonstrate excellent optical coupling for both individual QWIPs as well as large area QWIP arrays. However, the light coupling efficiency of the random reflector is almost independent of wavelength due to the random nature of the reflector. Therefore, random reflector coupled QWIPs do not exhibit narrow band spectral response. Unlike random reflectors, the light coupling efficiency of cross-gratings strongly depend on wavelength due to the periodicity of the cross-gratings. Hence by utilizing cross-grating light coupling techniques, narrow bandwidth high quantum efficiency QWIP FPAs are possible. This technique can be used to filter both single color and two-color FPAs.

An optimized set of grating parameters associated with the known spectral response of the QWIP can be obtained by using the modal expansion method. The electric and magnetic field vectors are matched at the boundary (z=0 plane where z is defined as shown in FIG. 18) between the diffractive field region and the rectangular cavity region. The field vectors in the diffracted field region (z>0), are expressed in terms of diffracted "orders". The field vectors in the diffracted field region inside the cavities (z<0) are expressed in terms of guided vector "modes". Each of these diffracted orders is associated with a plane wave propagating in a discrete direction which is specified by a pair of integers (p,q) due to the double periodicity of the grating structure. A guided vector "mode" inside the cavity means a vector field not only satisfying Maxwell's equations but also boundary conditions appropriate to the geometry of the cavity. These modes are specified by a pair of integers (n,m) due to the rectangular nature of the grating cavity.

As shown in FIG. 18, consider a plane wave 1802 incident upon the grating structure with the wave vector $\vec{k}$:

$$\vec{k} = \alpha_0 \hat{x} + \beta_0 \hat{y} - \gamma_{00} \hat{z}$$

where $\alpha = k \sin\theta \cos\phi$, $\beta_0 = k \sin\theta \sin\phi$, and $\theta_{00} = k \cos\theta$. The incident angles $\theta$ and $\phi$ are defined in FIG. 18. The (p,q)th order diffracted wave vector can be expressed as $$\vec{k}_{pg} = \alpha_p \hat{x} + \beta_q \hat{y} + \gamma_{pq} \hat{z}$$

where $$\alpha_p = \alpha_0 + p\frac{2\pi}{D_x},\ \beta_q = \beta_0 + q\frac{2\pi}{D_y},\ \gamma_{pq} = \sqrt{k^2 - \alpha_p^2 - \beta_{q'}^2},$$

±1, ±2, . . . . Then, the incident and diffracted electric field vector components in the x-y plane are given by:

$$\vec{E}_i^t = A_0 RTE_{00}(x,y,-z) + C_0 RTM_{00}(x,y,-z)$$

$$\vec{E}_r^t = \sum_{p,q} A_{pq} RTE_{pq}(x, y, z) + C_{pq} RTM_{pq}(x, y, z)$$

where $RTE_{pq}(x, y, z)$ and $RTM_{pq}(x, y, z)$ represent transverse electric (TE) and transverse magnetic (TM) resolved parts in the x-y plane which can be defined in terms of $\alpha_p$, $\beta_q$, $\gamma_{pq}$ and $\vec{k}_{pq}$. $A_{pq}$ and $C_{pq}$ are the fundamental unknowns of the diffraction problem. Here $A_0$ $C_0$, $RTE_{oo}(x, y, -z)$, $RTM_{00}(x, y, -z)$ are associated with the incident wave and can be expressed in terms of incident angles $\theta$, $\phi$, amplitude $E_0$ and polarization angle $\epsilon$. The x-y plane component of the electric field vector in a cavity can be expressed as:

$$\vec{E}_t^t = \sum_{n,m} [a_{nm} MTE_{nm}(x, y) + c_{nm} \cdot MTM_{nm}(x, y)] \sin(\mu_{nm}(z+h))$$

where $MTE_{nm}(x, y)$ and $MTM_{nm}(x, y)$ are TE and TM solutions to the Maxwell's equation for one-side-open-cavity with perfectly conducting walls; $a_{nm}$ and $c_{nm}$ are constants. Here $$\mu_{nm} = \sqrt{k^2 - \left(\frac{n\pi}{d_x}\right)^2 - \left(\frac{m\pi}{d_y}\right)^2}.$$

It is advantageous in 2-D grating problems to use TE and TM vector fields, because they are mutually orthogonal and can be normalized such that their inner product over a rectangular unit cell is unity. Applying continuity of transverse electric and magnetic fields across the boundary plane z=0, yields the following:

$$A_0 RTE_{00}(x, y, 0) + C_0 RTM_{00}(x, y, 0) +$$
$$\sum_{pq}(A_{pq} RTE_{pq}(x, y, o) + C_{pq} RTM_{pq}(x, y, 0)) =$$
$$\sum_{n,m}(a_{nm} MTE_{nm}(x, y) + c_{nm} MTM_{mn}(x, y)) \sin(\mu_{nm}h)(x, y, 0) +$$
$$\frac{k}{\gamma_{00}} C_0 RTM_{00}(x, y, 0) - \sum_{p,q}\left(\frac{\gamma_{pq}}{k} A_{pq} RTE_{pq}(x, y, 0) + \frac{k}{\gamma_{pq}} C_{pq} RTl\right) =$$
$$\sum_{n,m}\left(\frac{i\mu_{nm}}{k} a_{nm} MTE_{nm}(x, y) + \frac{ik}{\mu_{nm}} c_{nm} MTM_{nm}(x, y)\right) \cos(\mu_{nm}h)$$

By considering the orthogonal property of "orders" and "modes" a pair of coupled linear equations for A(p,q), and C(p,q), are obtained in following form:

$$A_{pq} + \sum_{P,Q} AA_{pqPQ} A_{PQ} + \sum_{P,Q} AC_{pqPQ} C_{PQ} = DA_{pq}$$

$$C_{pq} + \sum_{P,Q} CA_{pqPQ} A_{PQ} + \sum_{P,Q} CC_{pqPQ} C_{PQ} = DC_{pq}$$

where P, Q, p, q=0,±1, ±2, . . . . The constants involved in the above equations contain the inner product of TE and TM vectors of "orders" and "modes" over unit cells and summations over possible modes (i.e., n, m=0, 1 . . . ∞). The resulting system of equations are then solved for diffracted plane wave amplitudes by limiting the diffracted orders up to the first set of orders ($p^2+q^2 \leq 1$), or second set of orders ($p^2+q^2 \leq 2$). The efficiencies of the diffracted order are then calculated from the expression $$\rho_{pq} = \frac{1}{\gamma_{00}} \left( \gamma_{pq} |A_{pq}|^2 + \frac{k^2}{\gamma_{pq}} |C_{pq}|^2 \right).$$

The optimized set of grating parameters are obtained by maximizing $$\sum_{p,q} \rho_{pq} (\mathbf{E}_{pq} \cdot \mathbf{\hat{a}})^2,$$

where $\mathbf{E}_{pq}$ is the (p,q)th order electric field vector which can be reconstructed from wave amplitudes.

FIG. 10B discussed above, compares the calculated spectral variation of the absorption quantum efficiency of a QWIP with optimized 2-D grating (solid line), to the measured absorption quantum efficiency of a QWIP with 45° polished edge (dotted line). The absorption of the bare quantum well structure is obtained by experimental measurements and the grating is optimized to enhance the quantum efficiency at the peak response wavelength (i.e., $\lambda_p$=8.4 μm). For the calculation, incident light on the 30×30 μm² pixels through f/2.3 optics is assumed. For angles incident (i.e., θ≠0), absorption of the incident wave (before being diffracted from the grating) is also considered in the calculation. FIG. 10B clearly shows the reduction in the spectral band width and the sharp increase in the optical coupling efficiency.

Figure 19:
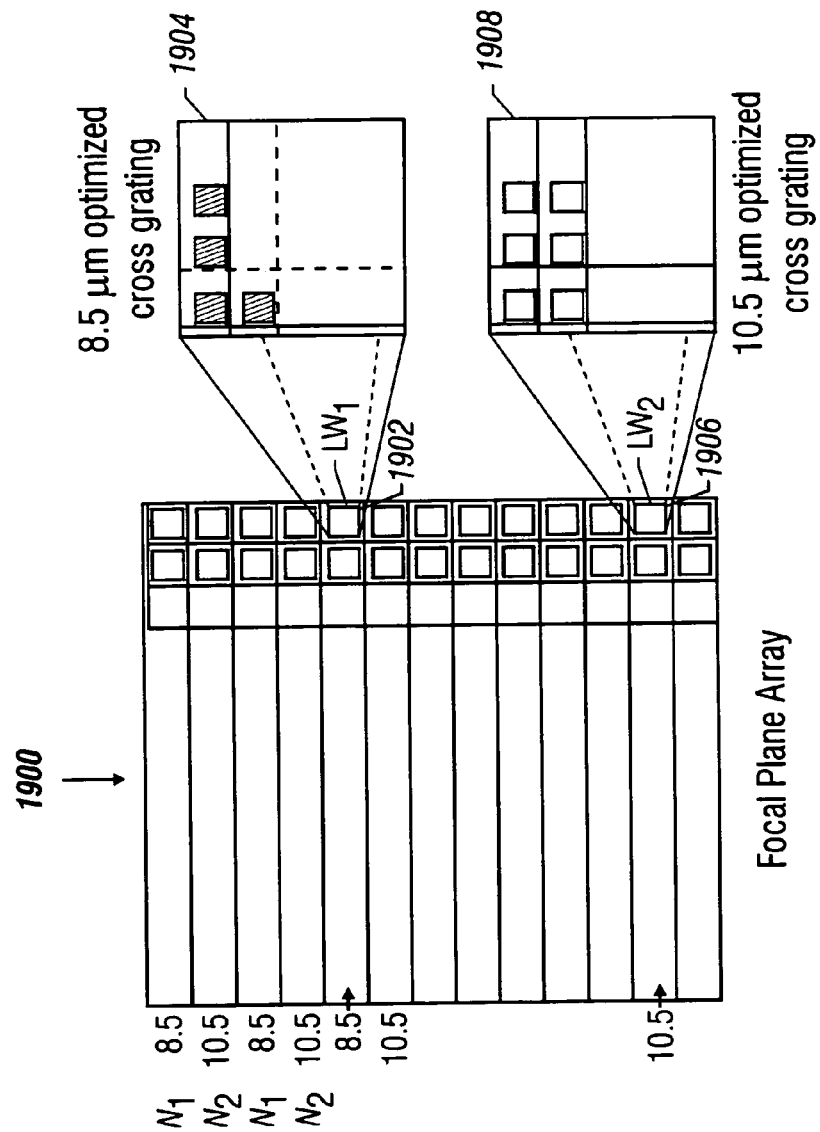
FIG. 19 shows a two-color QWIP FPA of the third embodiment of the invention with optimized cross-gratings.

FIG. 19 shows a two-color QWIP FPA 1900 with 8.5 μm peak wavelength QWIPs and 10.5 μm peak wavelength QWIPs of the third embodiment using the QWIP structure shown in FIGS. 17A–C. The FPA 1900 includes optimized cross-gratings to permit the detection of the two wavelength sensitive QWIPs separately. In particular, facing each QWIP in odd rows 1902 is a cross-grating 1904 optimized for 8.5 μm in accordance with the techniques described above. Likewise, facing each QWIP in even rows 1906 is a cross-grating 1908 optimized for 10.5 μm. The signals for alternating columns are read and displayed separately using a multiplexer such as the one shown in FIG. 16 and described above.

Figure 20:
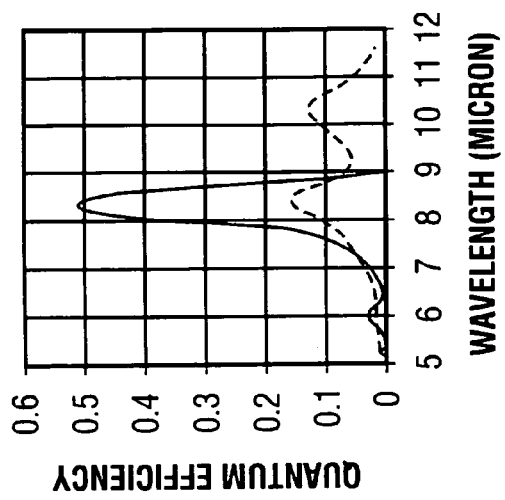
FIG. 20 shows the quantum efficiency of the QWIPs in the FPA of FIG. 19 that are optimized with gratings for a first wavelength.

FIG. 20 shows the spectral response variation of the 8.5 μm QWIP 1902 with the optimized cross-grating (solid line) and with a 45° polished edge and no grating (dotted line). This shows a significant increase in optical coupling efficiency as well as a reduction in the spectral bandwidth.

Figure 21:
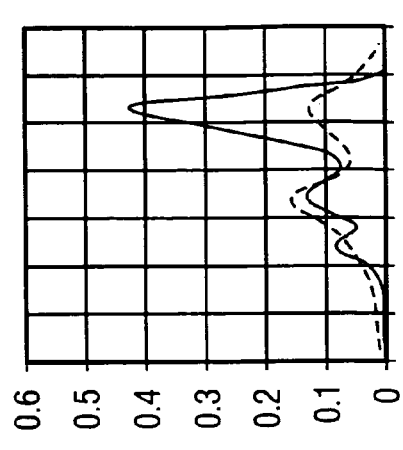
FIG. 21 shows the quantum efficiency of QWIPs in the FPA of FIG. 19 that are optimized with gratings for a second wavelength.

Likewise, FIG. 21 shows the quantum efficiency of 10.5 μm QWIPs 1900 with the optimized cross-grating (solid line) and with a 45° polished edge and no grating (dotted line) Again, dramatic increase in coupling efficiency and reduction in bandwidth is apparent.

Although only a few embodiments have been described in detail above, those having ordinary skill in the art will certainly understand that many modifications are possible in the preferred embodiment without departing from the teachings thereof. All such modifications are intended to be encompassed within the following claims.

What is claimed is:

1. A quantum well infrared photodetector (QWIP) comprising:
   a substrate formed of a semiconductor material;
   a plurality of photodetectors disposed relative to one another to form an array on said substrate, each photodetector having first and second quantum well structures, one stacked over the other and each comprising a plurality of alternating barrier layers and well layers, each well layer of each quantum well structure coupled between two barrier layers to support an intersubband transition between a bound ground energy state and an excited energy state within a common energy band where said excited energy state is substantially resonant with an energy of the well top,
   wherein materials, thicknesses and dimensions of said well layers and barrier layers are selected such that said first and said second quantum well structures effect intersubband transitions at first and second wavelengths, respectively, wherein none of said two quantum well structures is short circuited, and wherein said barrier layers are sufficiently thick to substantially eliminate carrier tunneling;
   a first set of optical cross gratings coupled to even rows of said detectors and optimized to diffract radiation at said first wavelength to be absorbed by said first quantum well structure; and
   a second set of optical cross gratings coupled to odd rows of said detectors and optimized to diffract radiation at said second wavelength to be absorbed by said second quantum well structure.

2. A QWIP as in claim 1 wherein said two quantum well structures in each photodetector are separated by an intermediate contact layer.

3. A QWIP as in claim 2 wherein said barriers in both quantum well structures are formed of $Al_xGa_{1-x}As$.

4. The QWIP as in claim 1 further comprising a multiplexer coupled to each photodetector in said array and generating a stream of data caused by radiation at said first wavelength and a stream of data caused by radiation at said second wavelength, so as to separately form images of the first and second wavelengths.

5. A QWIP as in claim 1 further comprising a continuum transport band, carrying a photocurrent from said wells, wherein the continuum transport band has a smooth energy level profile between wells in said two quantum well structures.

6. A QWIP as in claim 5 wherein said barriers in one of said two quantum well structures have a barrier height equal to that of the barriers in the other one of said two quantum well structures.

7. A QWIP as in claim 6 wherein each barrier is formed of a material including aluminum, wherein the aluminum mole ratio is the same for the barriers in both quantum well structures.

8. A QWIP as in claim 1 wherein said barrier layers are made of $Al_xGa_{1-x}As$, and said second group of wells are formed of $Al_xGa_{1-x}As$ where x is not equal to y.

9. A QWIP as in claim 1 wherein said excited energy state is substantially resonant with an energy of the well top and has a deviation from said well top by less than about 2% of the well top.

10. A QWIP as in claim 1, further comprising;
    a first contact layer formed over said substrate in each photodetector, wherein said first quantum well structure is formed on said first contact layer;

a second contact layer formed over said first quantum well structure in each photodetector;

a first electric contact connected to said second contact layer to output a signal caused by absorption of radiation at said first wavelength by said first quantum well structure;

a third contact layer formed over said second quantum well structure; and a second electric contact connected to said third contact layer to output a signal caused by absorption of radiation at said second wavelength by said second quantum well structure.

11. A QWIP as in claim 10, further comprising a multiplexer coupled to said first and said second electric contacts in each photodetector in said array and simultaneously generating a stream of data caused by radiation at said first wavelength and a stream of data caused by radiation at said second wavelength, so as to separately and simultaneously form images of said first and second wavelengths.

12. A QWIP as in claim 1, wherein well layers of one quantum well structure include GaAs and well layers of another quantum well structure include InGaAs.

13. A QWIP as in claim 1, wherein well layers of one quantum well structure include GaAs and well layers of another quantum well structure include AlGaAs.

14. A QWIP as in claim 1, wherein said barrier layers have a thickness from 500 angstroms to 600 angstroms.

15. A method, comprising:

providing an array of photodetectors in columns and rows, each photodetector having first and second quantum well structures stacked over each other to absorb radiation of first and second wavelengths, respectively, wherein each quantum well structure comprises a plurality of alternating barrier layers and well layers to support an intersubband transition between a bound ground energy state and an excited energy state within a common energy band;

making said excited energy state to be substantially resonant with an energy of the well top to increase efficiency in producing a photocurrent by photo excitation without tunneling;

making said barrier layers sufficiently thick to substantially eliminate carrier tunneling that contributes to a dark current; and using a first set of optical cross gratings coupled to even rows of said detectors to diffract radiation at said first wavelength to be absorbed by said first quantum well structure with an optimized efficiency; and using a second set of optical cross gratings coupled to odd rows of said detectors to diffract radiation at said second wavelength to be absorbed by said second quantum well structure with an optimized efficiency.

* * * * *